(12) United States Patent
French et al.

(10) Patent No.: US 8,836,327 B2
(45) Date of Patent: Sep. 16, 2014

(54) MICRO-FABRICATED ATOMIC MAGNETOMETER AND METHOD OF FORMING THE MAGNETOMETER

(75) Inventors: William French, San Jose, CA (US); Philipp Lindorfer, San Jose, CA (US); Peter J. Hopper, San Jose, CA (US); Roozbeh Parsa, San Jose, CA (US); Andrew James West, Santa Clara, CA (US); Byron Jon Roderick Shulver, Inverclyde (GB)

(73) Assignee: Texas Instruments Incorporated, Dallas, TX (US)

( * ) Notice: Subject to any disclaimer, the term of this patent is extended or adjusted under 35 U.S.C. 154(b) by 356 days.

(21) Appl. No.: 13/314,097

(22) Filed: Dec. 7, 2011

(65) Prior Publication Data

US 2013/0147472 A1 Jun. 13, 2013

(51) Int. Cl.
*G01R 33/02* (2006.01)
(52) U.S. Cl.
USPC ......... 324/244.1; 324/244; 324/252; 257/421
(58) Field of Classification Search
CPC .............................. G01R 33/26; G01R 33/032
USPC ....................................... 324/244.1, 244, 252
See application file for complete search history.

(56) References Cited

U.S. PATENT DOCUMENTS

| 7,145,333 | B2* | 12/2006 | Romalis et al. ............... 324/304 |
| 7,323,941 | B1 | 1/2008 | Happer et al. |
| 7,826,065 | B1 | 11/2010 | Okandan et al. |
| 7,872,473 | B2 | 1/2011 | Kitching et al. |
| 8,054,074 | B2* | 11/2011 | Ichihara et al. ............... 324/304 |
| 2010/0288525 | A1* | 11/2010 | Basavanhally et al. ..... 174/50.52 |
| 2010/0289491 | A1* | 11/2010 | Budker et al. ................ 324/304 |
| 2011/0101974 | A1* | 5/2011 | Nagasaka .................. 324/244.1 |
| 2011/0295110 | A1* | 12/2011 | Manzke et al. ............... 600/424 |
| 2013/0127879 | A1* | 5/2013 | Burns et al. .................... 345/501 |

FOREIGN PATENT DOCUMENTS

| JP | 2009105225 A | 5/2009 |
| KR | 100835438 B1 | 6/2008 |

OTHER PUBLICATIONS

Schwindt, Peter D. D. et al., "Chip-scale atomic magnetometer with improved sensitivity by use of the Mx technique", Applied Physics Letters, 90, 2007, pp. 081102-1 through 081102-3.
Jimenez-Martinez, Ricardo et al., "Sensitivity Comparison of Mx and Frequency-Modulated Bell-Bloom Cs Magnetometers in a Microfabricated Cell", IEEE Transactions on Instrumentation and Measurement, vol. 59, No. 2, 2010, pp. 372-378.
Woetzel, S. et al., "Microfabricated atomic vapor cell arrays for magnetic field measurements", Review of Scientific Instruments, 82, 2011, pp. 033111-1 through 033111-4.

(Continued)

*Primary Examiner* — Huy Q Phan
*Assistant Examiner* — Dustin Dickinson
(74) *Attorney, Agent, or Firm* — Eugene C. Conser; Frederick J. Telecky, Jr.

(57) ABSTRACT

The cost and size of an atomic magnetometer are reduced by attaching a vapor cell structure that has a vapor cell cavity to a base die that has a laser light source that outputs light to the vapor cell cavity, and attaching a photo detection die that has a photodiode to the vapor cell structure to detect light from the laser light source that passes through the vapor cell cavity.

15 Claims, 21 Drawing Sheets

(56) References Cited

OTHER PUBLICATIONS

Knappe, Svenja A. et al., "Microfabricated saturated absorption laser spectrometer", Optics Express, vol. 15, No. 10, 2007, pp. 6293-6299.
Knappe, Svenja, "MEMS Atomic Clocks", Comprehensive Microsystems, vol. 3, 2007, pp. 571-612.
Prouty, Mark, "Final Report Development of a Micro-Fabricated Total-Field Magnetometer", Strategic Environmental Research and Development Program (SERDP) Project MR-1512 [online], Mar. 2011, pp. i-xi and 1-162 [retrieved on Jul. 13, 2011]. Retrieved from the Internet < URL: http://www.serdp.org/Program-Areas/Munitions-Response/Land/Sensors/MR-1512/MR-1512-FR>.
Kitching, John et al., "Chip-Scale Atomic Devices", Solid-State Sensors, Actuators, and Microsystems Workshop, 2006, pp. 108-113.
Schwindt, Peter D. D. et al., "Chip-scale atomic magnetometer", Applied Physics Letters, vol. 85, No. 26, 2004, pp. 6409-6411.
U.S. Appl. No. 13/182,510, filed Jul. 14, 2011 to Philipp Lindorfer et al.

* cited by examiner

MICRO-FABRICATED ATOMIC MAGNETOMETER AND METHOD OF FORMING THE MAGNETOMETER

BACKGROUND OF THE INVENTION

1. Field of the Invention

The present invention relates to atomic magnetometers and, more particularly, to a micro-fabricated atomic magnetometer and a method of forming the magnetometer.

2. Description of the Related Art

An atomic magnetometer is a device that measures the strength of a magnetic field by determining a frequency known as the Larmor frequency. The Larmor frequency, in turn, is the frequency of the magnetic moment of a contained group of in-phase, spinning, outer shell electrons of alkali atoms moving in precession in response to the magnetic field. A magnetic field strength B is defined by the equation $B = h\nu_L/\gamma$, where h is Plank's constant, $h\nu_L$ is the Larmor frequency, and $\gamma$ is the gyromagnetic ratio (e.g., 7 Hz/nT for $^{87}$Rb and 3.5 Hz/nT for Cs).

FIG. 1 shows a block diagram that illustrates an example of a prior art atomic magnetometer 100. As shown in FIG. 1, atomic magnetometer 100 includes a vertical cavity surface emitting laser (VCSEL) 110, and an optics package 112 that lies above VCSEL 110. Further, atomic magnetometer 100 also includes a vapor cell 114 that lies above optics package 112, and a photo detector 116 that lies above vapor cell 114.

In addition, vapor cell 114 contains a gas 118 that includes alkali atoms, which have a single electron in the outer shell, and buffer atoms, which reduce collisions between the alkali atoms and the inner surface of vapor cell 114. For example, vapor cell gas is commonly implemented with alkali atoms such as $^{85}$Rb atoms, $^{87}$Rb atoms, K, and Cs atoms, and buffer atoms such as $N_2$. Further, atomic magnetometer 100 can optionally include a lower coil 120 and an upper coil 122 that lie below and above vapor cell 114.

In operation, VCSEL 110 outputs light which is attenuated and circularly polarized by optics package 112. The circularly polarized light output by optics package 112 is then directed into vapor cell 114. The light output by VCSEL 110 is tuned to a frequency which, when circularly polarized, is absorbed by the single electrons in the outer shells of the alkali atoms in the gas 118 contained within vapor cell 114.

For example, VCSEL 110 can be tuned to output light with a wavelength of 794.8 nm which, after being circularly polarized, is absorbed by the single electrons in the outer shells of the $^{87}$Rb atoms. VCSEL 110 can alternately be turned to output light with a wavelength of 894.35 nm which, after being circularly polarized, is absorbed by the single electrons in the outer shells of the Cs atoms.

When the single electron in the outer shell of an alkali atom absorbs light energy, the electron transitions to a higher energy level, and then falls back to one of a number of energy levels (Zeeman sublevels within the hyperfine energy levels) that are associated with the outer shell. The quantum selection rules define exactly which state the electron will result in. If the electron absorbs right hand circularly polarized light, then the electron rises to a higher energy level, while the projection number M of the electron is raised by +1.

When falling back, the electron emits a photon in a random direction, and always falls back to the highest energy level that is associated with the outer shell. In addition, when the electron falls back, the projection number M of the electron also changes by −1, 0 or +1 in a random manner.

Thus, if a number of such events occur to the same electron, each time the electron goes to a higher state, the projection number M of the electron is always +1. However, on average, as the electron falls down to the ground state, the change in the projection number M of the electron is zero. As a result, the electron will eventually land on the highest M level in the ground state. In the gas under consideration, both the ground state $S_{1/2}$ and the elevated $P_{1/2}$ (or $P_{3/2}$) state have the same number for M levels. Thus, when the electron reaches the highest M level in the ground state, the electron cannot be pumped because there is not a higher M level in the excited state.

To again reabsorb light, the population in the ground state M levels has to be depumped. Additional energy (magnetic or optical) must be supplied to the electron at a frequency called the Larmor frequency. The additional energy at the Larmor frequency causes the electron in the highest ground state M level to drop to a lower M level that is associated with the outer shell where the electron can again absorb light energy.

Thus, the photons that pass out of vapor cell 114 into photo detector 116 include a non-absorption component, which represents the light output by VCSEL 110 that was not absorbed by the electrons in the outer shell of the gas 118 within vapor cell 114, and an emission component, which represents the photons that are randomly emitted by the falling electrons. Photo detector 116 detects these photons, and generates an output signal that has both a non-absorption component and an emission component.

Two of the common approaches to adding additional energy at the Larmor frequency are the Bell-Bloom (BB) technique and the $M_X$ technique. In the BB technique, the light output by VCSEL 110 is modulated by a frequency that is swept across a range of frequencies. When the light output by VCSEL 110 is frequency modulated at the Larmor frequency, the electrons drop to a lower energy level and begin reabsorbing light energy, which causes a noticeable dip in the intensity of light received by photo detector 116. Thus, the Larmor frequency can be determined by determining the modulated frequency that caused the intensity of the received light to dip.

In the $M_X$ technique, an RF signal is applied to the lower and upper coils 120 and 122 to create an alternating magnetic field that is aligned with the longitudinal axis of the light emitted by VCSEL 110, while the frequency of the RF signal is swept across a range of frequencies. When the frequency of the RF signal becomes equal to the Larmor frequency, the electrons drop to a lower energy level and begin reabsorbing light energy, which causes a noticeable dip in the intensity of light received by photo detector 116. Thus, the Larmor frequency can be determined by determining the RF frequency that caused the intensity of the received light to dip.

Two of the drawbacks of conventional atomic magnetometers are size and cost, which then limit the types of applications where atomic magnetometers can be commercially utilized. Thus, there is a need for micro-fabricated atomic magnetometers which can be mass produced in conventional integrated circuit fabrication facilities, thereby reducing both size and cost and significantly increasing the types of applications where atomic magnetometers can be commercially utilized.

DETAILED DESCRIPTION OF THE INVENTION

Figure 1:
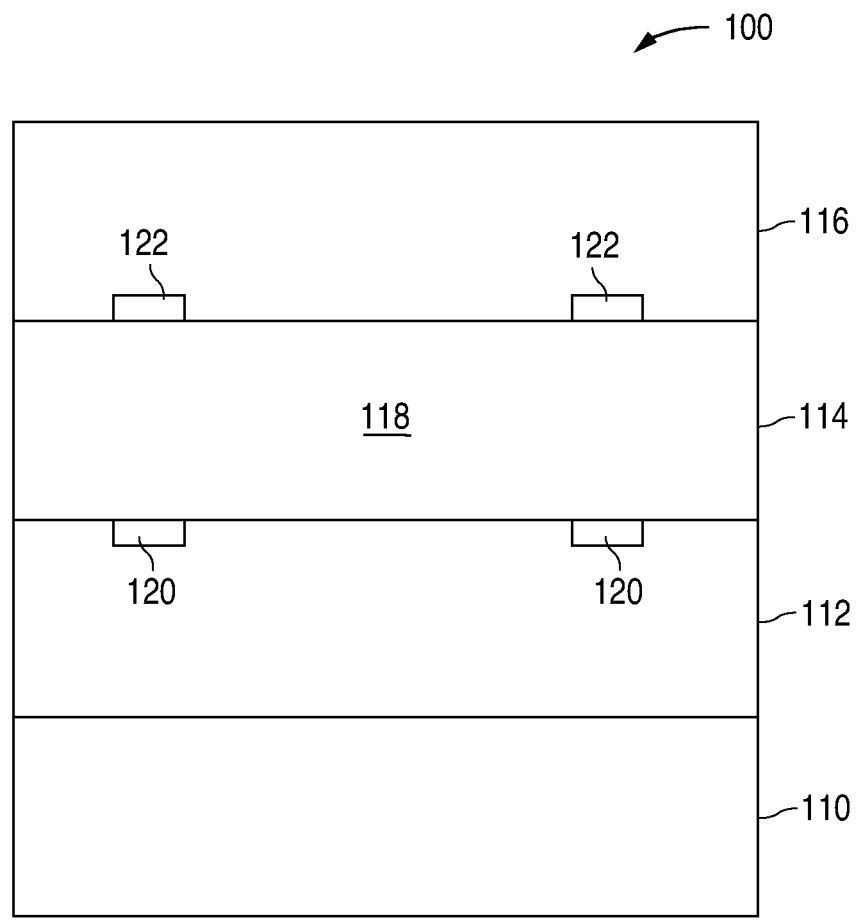
FIG. 1 is a block diagram illustrating an example of a prior art atomic magnetometer 100.
Figure 2:
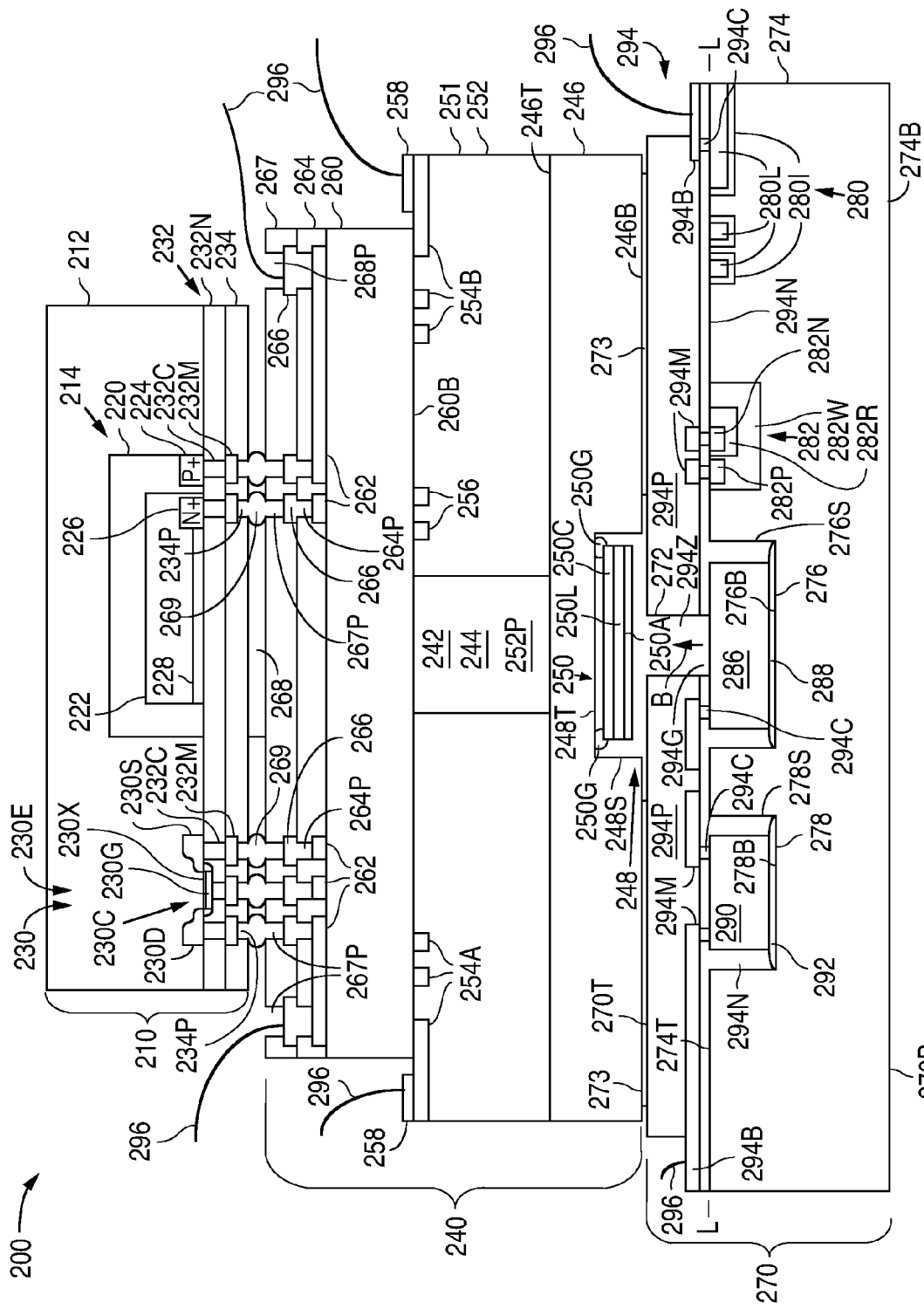
FIG. 2 is a cross-sectional view illustrating an example of a micro-fabricated atomic magnetometer 200 in accordance with the present invention.

FIG. 2 shows a cross-sectional view that illustrates an example of a micro-fabricated atomic magnetometer 200 in accordance with the present invention. As shown in FIG. 2, atomic magnetometer 200 includes a photo detection die 210 that receives a modulated light and generates a light signal that represents the magnitude of the received light.

As further shown in FIG. 2, photo detection die 210, which is inverted in FIG. 2, includes a semiconductor substrate 212, and a photodiode 214 that touches semiconductor substrate 212. In the FIG. 2 example, semiconductor substrate 212 is implemented with a conventional substrate material, such as p− single-crystal silicon.

Photodiode 214, in turn, includes a p− well 220 that touches semiconductor substrate 212, and an n− region 222 that touches p− well 220. Photodiode 214 also includes a p+ contact region 224 that touches p− well 220, and an n+ contact region 226 that touches n− region 222. In addition, photodiode 214 can optionally include a thin p+ surface region 228 that touches n− region 222 to reduce surface recombination. P− well 220 has a dopant concentration that is greater than the dopant concentration of p− semiconductor substrate 212.

Photo detection die 210 also includes a number of circuit elements 230 that are formed in and on the top surface of semiconductor substrate 212. The circuit elements 230 include transistors, resistors, capacitors, diodes and similar circuit devices. For simplicity, only one NMOS transistor 230 is illustrated to represent the circuit elements 230.

NMOS transistor 230 has an n-type source 230S and an n-type drain 230D spaced apart by a p-type channel 230C, a gate oxide layer 230X that touches the top surface of semiconductor substrate 212 over channel 230C, and a gate 230G that touches gate oxide layer 230X over channel 230C. When electrically connected together, the circuit elements 230 form an electronic circuit 230E that controls photodiode 214 and amplifies the signals output from photodiode 214 to generate the light signal.

Photo detection die 210 further includes an interconnect structure 232 that touches the top surface of semiconductor substrate 212 and the circuit elements 230. Interconnect structure 232 includes a non-conductive structure 232N, and contacts 232C that extend through non-conductive structure 232N to make electrical connections with p+ region 224, n+ region 226, and the conductive regions of the circuit elements 230, such as source 230S, drain 230D, and gate 230G.

In addition, interconnect structure 232 includes a number of metal-1 structures 232M that lie on non-conductive structure 232N and touch the contacts 232C. In a first embodiment, the metal-1 structures 232M can function only as bond pad structures (locations for external electrical connections) such that an adjoining die structure provides all of the electrical interconnection required by photodiode 214 and the circuit elements 230 of electronic circuit 230E.

Alternately, in a second embodiment, the metal-1 structures 232M can function as bond pad structures and traces. For example, the bond pad structures can be used for power and ground, and to input signals to and output signals from electronic circuit 230E, while the traces can be used to electrically interconnect photodiode 214 and the circuit elements 230 of electronic circuit 230E. (Although interconnect structure 232 is shown with a single metal layer, additional metal layers can also be used.)

Photo detection die 210 can optionally further include a passivation layer 234 that covers non-conductive structure 232N and the metal-1 traces 232M. Passivation layer 234, which is non-conductive and moisture resistant, has a number of openings 234P that expose the pads of the metal-1 structures 232M.

As further shown in FIG. 2, atomic magnetometer 200 also includes a vapor cell die 240 that receives a light and generates the modulated light. Vapor cell die 240, which is attached to photo detection die 210, has a vapor cavity 242 that is vertically aligned with photodiode 214, and a gas 244 that is hermetically sealed within vapor cavity 242. Gas 244, in turn, includes alkali atoms and buffer atoms. For example, gas 244 can be implemented with alkali atoms such as $^{85}$Rb atoms, $^{87}$Rb atoms, or Cs atoms, and buffer atoms such as $N_2$.

Vapor cell die 240 additionally has a transparent structure 246 that has a top surface 246T, a bottom surface 246B, and an opening 248 that extends into transparent structure 246 from the bottom surface 246B of transparent structure 246. A portion of the top surface 246T of transparent structure 246 forms the bottom surface of vapor cavity 242.

In the present example, transparent structure 246 is implemented with glass that has an ionic impurity, such as sodium ions, that makes the glass suitable for anodic bonding to single-crystal silicon. For example, Eagle XG® or Pyrex® by Corning or Schott Borofloat® by Schott are glass products that can be utilized. Glass is non-conductive. Opening 248, which lies directly vertically below and spaced apart from vapor cavity 242, has a side wall surface 248S, and a top surface 248T that lies below and spaced apart from the top surface 246T of transparent structure 246.

Further, vapor cell die 240 includes an optics package 250 that is attached to the top surface 248T of opening 248. Optics package 250 can be attached with drops 250G of a conventional glue or die attach adhesive placed at the corners of optics package 250. Optics package 250 outputs circularly polarized light in response to light received from a light source, and can be implemented with any arrangement that outputs circularly polarized light.

In the FIG. 2 example, optics package 250 includes an attenuator 250A that reduces the intensity of the input light, a linear polarizer 250L that linearly polarizes the light output from attenuator 250A, and a quarter wave plate circular polarizer 250C that circularly polarizes the light output from linear polarizer 250L.

Optics package 250 is commercially available from a number of sources, such as Thorlabs (www.thorlabs.com) or CVI Melles Griot (www.cvimellesgriot), which provide optics packages to meet customer specified requirements for the layers and exterior dimensions. (Thorlabs NE220B is an attenuator, Thorlabs LPVIS100 is a linear polarizer, and CVI Melles Griot QWPO-895-15-4 is a circular polarizer.)

Vapor cell die 240 also has a vapor cell structure 251 that is attached to transparent structure 246. Vapor cell structure 251 has a substrate 252, and a number of heaters, such as heaters 254A and 254B, which touch substrate 252. Substrate 252, which in the present example is implemented with conventional p− single-crystal silicon, has a through-the-material opening 252P that extends completely through substrate 252 to form the side wall surface of vapor cavity 242.

In the FIG. 2 example, the heaters 254A and 254B are each implemented as an n+ resistor strip that touches substrate 252, and laid out to minimize the magnetic field that is generated by current flowing through the n+ strip. For example, the heaters 254A and 254B can each be laid out in long parallel n+ strips with alternate ends connected together to form a serpentine pattern.

In operation, a current is passed through the heaters 254A and 254B to heat the gas 244 within vapor cavity 242. The current can flow continuously if the magnetic fields can be adequately cancelled, or turned on when needed for heat and turned off to remove any interference provided by current in the heaters 254A and 254B.

In addition, vapor cell die 240 has a temperature sensor 256 that touches substrate 252 and lies adjacent to through-the-wafer opening 252P. In the FIG. 2 example, temperature sensor 256 is implemented as an n+ resistor strip that touches substrate 252, and is laid out to minimize the magnetic field that is generated by current flowing through the n+ strip. For example, temperature sensor 256 can be laid out in two long parallel n+ strips with one pair of ends connected together to form a long U-shape pattern.

In operation, a current is passed through temperature sensor 256, and the resistance of temperature sensor 256 varies as the temperature around vapor cavity 242 varies. The current can flow continuously if the magnetic fields can be adequately cancelled, or turned on when needed for temperature measurement and turned off to remove any interference provided by current in temperature sensor 256. Temperature sensor 256 can be accurate to within a few degrees of the actual temperature.

In addition, vapor cell die 240 has a number of bond pad structures 258 that touch the ends of the n+ strips of the heaters 254A and 254B and the ends of the n+ strip of temperature sensor 256. The bond pad structures 258, which can be implemented with, for example, aluminum, provide points of external electrical connection to the heaters 254A and 254B and temperature sensor 256. Further, the ends of n+ strips of the heaters 254A and 254B and the ends of the n+ strip of temperature sensor 256 that lie below the bond pad structures 258 can optionally be silicided.

Vapor cell die 240 also has a transparent structure 260 that touches substrate 252 of vapor cell structure 251. Transparent structure 260 has a bottom surface 260B, a portion of which forms the top surface of vapor cavity 242. In the present example, transparent structure 260 is implemented with glass that has an ionic impurity, such as sodium ions, that makes the glass suitable for anodic bonding to single-crystal silicon. For example, Eagle XG® or Pyrex® by Corning or Schott Borofloat® by Schott can be utilized.

Further, vapor cell die 240 also has a number of metal traces 262 that touch the top surface of transparent structure 260, and a passivation layer 264 that touches transparent structure 260 and the metal traces 262. Passivation layer 264, which is non-conductive and moisture resistant, has a number of openings 264P that expose bond pad regions of the metal traces 262.

In addition, vapor cell die 240 includes a number of bond pad structures 266 that touch passivation layer 264 and the metal traces 262, and a passivation layer 267 that touches passivation layer 264 and the bond pad structures 266. Passivation layer 267, which is non-conductive and moisture resistant, has a number of openings 267P that expose regions of the bond pad structures 266. Passivation layers 264 and 267 can optionally be omitted.

As further shown in FIG. 2, atomic magnetometer 200 also includes a transparent epoxy 268 that touches passivation layers 234 and 267, and a number of solder balls 269 that electrically connect the metal-1 structures 232M to the bond pad structures 266. When the metal-1 structures 232M function only as pads, then the metal traces 262 provide all of the electrical interconnection required by photodiode 214 and the circuit elements 230 of electronic circuit 230E, as well as providing points of external access for electronic circuit 230E. When the metal-1 structures 232M function as bond pad structures and traces, then the metal traces 262 provide points of external access for electronic circuit 230E which is positioned in a flip chip orientation.

As additionally shown in FIG. 2, atomic magnetometer 200 further includes a base die 270 that generates the light output to vapor cell die 240. Base die 270, which is attached to vapor cell die 240, has a top surface 270T, a bottom surface 270B, and a light opening 272 that extends into die 270 from the top surface 270T of die 270 to expose a laser light source that outputs a light beam B.

In addition, the top surface 270T of base die 270 is attached to transparent structure 246 of vapor cell die 240 with a layer 273 of a conventional glue or die attach adhesive. The longitudinal axis of the light beam B output by the laser light source is vertically aligned with photodiode 214 and vapor cavity 242.

As further shown in FIG. 2, base die 270 includes a semiconductor substrate 274 that has a top surface 274T, and a bottom surface 274B that coincides with the bottom surface 270B of base die 270. Semiconductor substrate 274 has a VCSEL opening 276 and a die opening 278 that each extends into semiconductor substrate 274 from the top surface 274T of semiconductor substrate 274.

VCSEL opening 276 has a bottom surface 276B and a side wall surface 276S, while die opening 278 has a bottom surface 278B and a side wall surface 278S. In the FIG. 2 example, semiconductor substrate 274 is implemented with a conventional substrate material, such as p-type single crystal silicon.

In addition, base die 270 also includes a heater 280 that touches semiconductor substrate 274. In the FIG. 2 example, heater 280 is implemented with an insulating oxide outer layer 2801, and a strip of undoped polysilicon 280L that is laid out to minimize the magnetic field that is generated by current flowing through heater 280. For example, heater 280 can be laid out in long parallel strips with alternate ends connected together to form a serpentine pattern.

As shown, the top surface of heater 280 lies in the same plane L as the top surface 274T of semiconductor substrate 274, while the bottom surface of heater 280 is vertically spaced apart from the bottom surface 274B of semiconductor substrate 274. (Heater 280 can alternately be implemented as heaters 254A and 254B are implemented, and heaters 254A and 254B can alternately be implemented as heater 280 is implemented.)

Base die 270 further includes a temperature sensor 282 that has a top surface which lies in the same plane L as the top surface 274T of semiconductor substrate 274. In the FIG. 2 example, temperature sensor 282 is implemented with a diode, which has a p-type well 282W and an n-type region 282R. In addition, the diode also has a p+ contact region 282P that touches p-type well 282W, and an n+ contact region 282N that touches n-type region 282R. The current through a diode varies in response to the temperature of the diode. (Although only one temperature sensor 282 is illustrated, additional temperature sensors can also be used.)

As further shown in FIG. 2, base die 270 includes a conventionally-fabricated vertical cavity surface emitting laser (VCSEL) 286 that is attached to the bottom surface 276B of VCSEL opening 276 by an adhesive layer 288. Adhesive layer 288 can be implemented with, for example, a conventional thermally-conductive glue or die attach adhesive. VCSEL 286 is commercially available from a number of sources, such as Princeton Optronics (www.princetonoptrics.com) or M-Com (www.m-com.com.tw/en), which provide VCSELs to meet customer specified requirements for light frequency, tuning range, power rating, and exterior dimensions. VCSEL 286 is the laser light source that provides the light with the longitudinal axis B.

Base die 270 additionally has an integrated circuit 290 that is attached to the bottom surface 278B of die opening 278 by an adhesive layer 292. Adhesive layer 292 can be implemented with, for example, a conventional thermally conductive glue or die attach adhesive. Integrated circuit 290 is a conventionally-fabricated die that includes one or more conventional electronic circuits that control the current flow through the heaters 254A, 254B, and 280, detect the output of the temperature sensors 256 and 282, control the operation of VCSEL 286, and process the signals output by electronic circuit 230E to provide an atomic magnetometer.

Further, base die 270 has an interconnect structure 294 that touches the top surface of semiconductor substrate 274. Interconnect structure 294 includes a non-conductive structure 294N, and contacts 294C that extend through non-conductive structure 294N to make electrical connections with heater 280, temperature sensor 282, VCSEL 286, and integrated circuit 290. Non-conductive structure 294N also has a laser opening 294G that exposes the laser output of VCSEL 286.

In addition, interconnect structure 294 includes a number of metal-1 structures 294M that lie on non-conductive structure 294N and touch the contacts 294C. The metal-1 structures 294M can function as pads and traces. For example, the pads can be used for power and ground, and to input signals to and output signals from integrated circuit 290, while the traces can be used to electrically interconnect heater 280, temperature sensor 282, VCSEL 286, and integrated circuit 290.

Interconnect structure 294 also includes a passivation layer 294P that covers non-conductive structure 294N and the metal-1 traces 294M. Passivation layer 294P, which is non-conductive and moisture resistant, has a number of openings that expose portions of the metal-1 traces 294M to form bond pad structures 294B for external electrical connections, and a laser opening 294Z that exposes the laser output of VCSEL 286. (Although interconnect structure 294 is shown with a single metal layer, additional metal layers can also be used.)

As further shown in FIG. 2, atomic magnetometer 200 additionally includes a number of bonding wires 296 which are bonded to the bond pad structures 258, the bond pad structures 266, and the bond pad structures 294B to provide an electrical connectivity between photo detector die 210, vapor cell die 240, and base die 270 as well as with the outside world.

In the operation of atomic magnetometer 200, VCSEL 286 outputs the light beam B with a wavelength which, after being circularly polarized by optics package 250, is absorbed by the single electrons in the outer shells of the alkali atoms of the gas 244 within hermetically sealed vapor cavity 242. The electrons jump to a higher energy level as the electrons absorb light energy, and then fall back emitting photons in random directions. In the FIG. 2 example, the Bell-Bloom (BB) technique is used to frequency modulate the light to identify the Larmor frequency and enable the electrons to again re-absorb light energy.

In the present example, the light that passes out of vapor cavity 242 is detected by photodiode 214, which generates a measured light signal in response to the detection. The photons that pass out of vapor cavity 242 into photodiode 214 include a non-absorption component, which represents the light output by VCSEL 286 that was not absorbed by the electrons in the outer shells of the alkali atoms of the gas 244 within vapor cavity 242, and an emission component, which represents the photons which are randomly emitted by the falling electrons. Because of the randomness of the emission component, the emission component is, on average, equal over time.

Electronic circuit 230E, which controls the voltages placed on photodiode 214, receives the measured light signal from photodiode 214, and generates an amplified light signal that is output to integrated circuit 290. As the electrons drop to a lower energy level and begin reabsorbing light energy, the re-absorption causes a noticeable dip in the intensity of the amplified light signal. Integrated circuit 290 then determines the Larmor frequency by determining the modulated frequency that caused the intensity of the amplified light signal to dip.

Figure 3A:
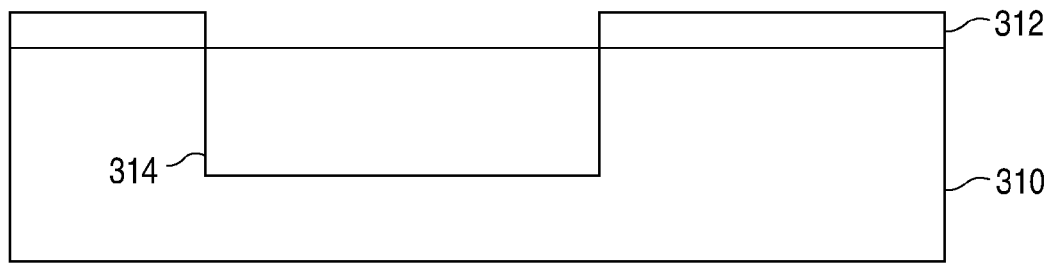
FIGS. 3A-3F are a series of cross-sectional views illustrating an example of a method of forming a photo detector die in accordance with the present invention.

FIGS. 3A-3F show a series of cross-sectional views that illustrate an example of a method of forming a photo detector die in accordance with the present invention. As shown in FIG. 3A, the method utilizes a conventionally formed p– single-crystal silicon wafer 310, and begins by forming a patterned photoresist layer 312 on the top surface of p– single-crystal silicon wafer 310 in a conventional manner.

After patterned photoresist layer 312 has been formed, the exposed regions of single-crystal silicon wafer 310 are implanted with a p-type dopant, such as boron, and driven in to form a number of p– wells 314 in wafer 310. Wafer 310 has rows and columns of identical die regions, and a p– well 314 is formed in each die region. For simplicity, only one die region is shown in FIGS. 3A-3F.

P− well 314 has a dopant concentration that is greater than the dopant concentration of p− single-crystal silicon wafer 310. Once p− well 314 has been formed, photoresist layer 312 is removed in a conventional manner, such as with acetone. Following this, wafer 310 is cleaned to remove organics, such as with a conventional Piranha etch.

Figure 3B:
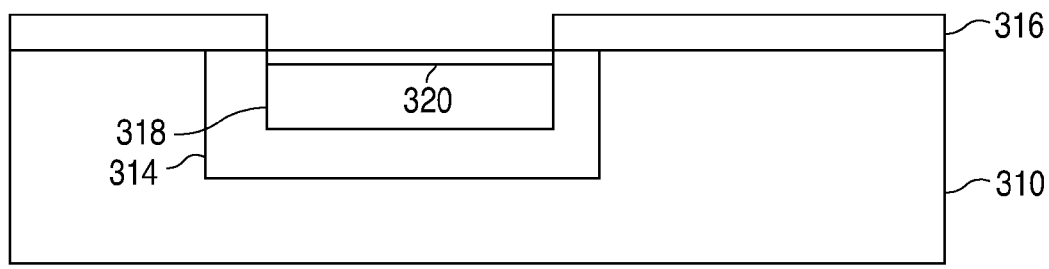

As shown in FIG. 3B, after wafer 310 has been cleaned to remove organics, a patterned photoresist layer 316 is formed on p− single-crystal silicon wafer 310 in a conventional manner. After patterned photoresist layer 316 has been formed, the exposed regions of p− single-crystal silicon wafer 310 are implanted with an n-type material, such as phosphorous, at a lower implant energy, and driven in to form an n-type region 318 in each p− well 314.

In the present example, a p-type dopant is next implanted at a lower implant energy, and driven in to form a thin p+ layer 320 that lies above n-type region 318 to reduce surface recombination. After thin p+ layer 320 has been formed, patterned photoresist layer 316 is removed in a conventional manner, such as with acetone. Following this, wafer 310 is cleaned to remove organics, such as with a conventional Piranha etch.

Figure 3C:
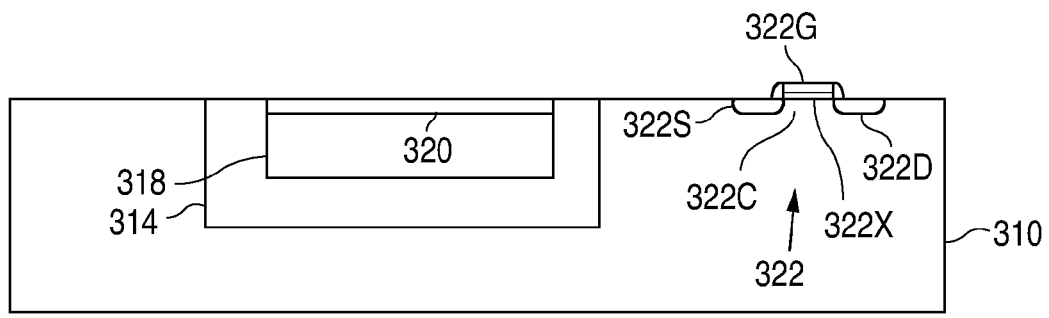

As shown in FIG. 3C, after wafer 310 has been cleaned to remove organics, a number of device structures 322 are formed in and on the top surface of p− single-crystal silicon wafer 310 in each die region in a conventional manner. In the FIG. 2 example, the device structures 322 are represented by a lightly-doped n-type source 322S, a lightly-doped n-type drain 322D, a p-type channel 322C that lies between source 322S and drain 322D, a gate oxide layer 322X that touches the top surface of p− single-crystal silicon wafer 310 over channel 322C, and a gate 322G that touches oxide layer 322G over channel 322C.

Figure 3D:
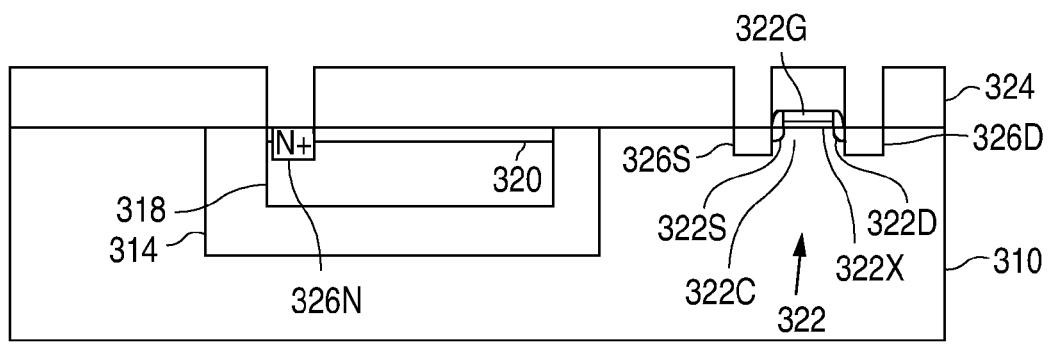

Next, as shown in FIG. 3D, a patterned photoresist layer 324 is formed to touch p− single-crystal silicon wafer 310 in a conventional manner. After patterned photoresist layer 324 has been formed, the exposed regions of p− single-crystal silicon wafer 310 are implanted with an n-type dopant, such as phosphorous, and driven in to form an n+ contact region 326N in each n-type region 318.

In addition, the implant also forms the n+ regions required to form the n-type circuit elements, such as the NMOS transistors, of an electronic circuit, such as electronic circuit 230E, that is formed in each die region. In the FIG. 2 example, the implant also forms n+ source 326S and n+ drain region 326D.

Once the n+ regions, such as n+ contact region 326N, n+ source region 326S, and n+ drain region 326D, have been formed, patterned photoresist layer 324 is removed in a conventional manner, such as with acetone. Following this, wafer 310 is cleaned to remove organics, such as with a conventional Piranha etch.

Figure 3E:
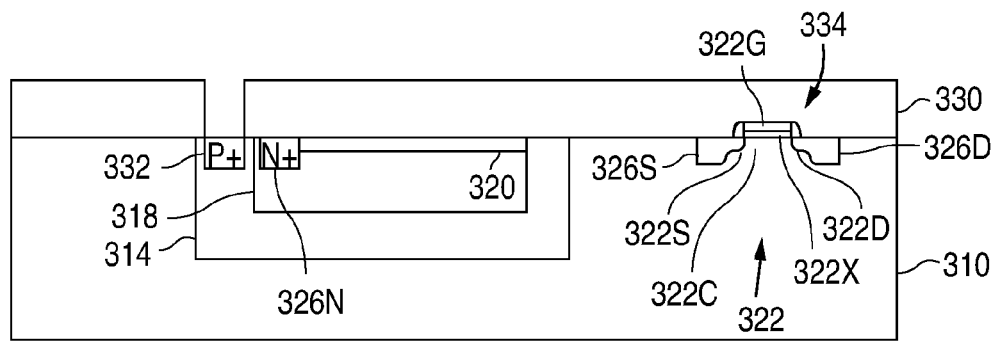

As shown in FIG. 3E, after wafer 310 has been cleaned to remove organics, a patterned photoresist layer 330 is formed to touch p-type single-crystal silicon wafer 310 in a conventional manner. After patterned photoresist layer 330 has been formed, the exposed regions of single-crystal silicon wafer 310 are implanted with a p-type dopant, such as boron, and driven in to form a p+ contact region 332 in each p− well 314.

Further, the implant also forms the p+ regions required to form the p-type circuit elements, such as the PMOS transistors, of the electronic circuit that is formed in each die region. In the FIG. 2 example, the electronic circuit, which can include transistors, resistors, capacitors, diodes, and similar circuit devices, is represented by an NMOS transistor 334, which includes n− source 322S/n+ source 326S, n− drain 322D/n+ drain 326D, p-type channel 322C, gate oxide layer 322X, and gate 322G. Further, in each die region, p− well 314, n-type region 318, thin p+ layer 320, n+ contact region 326N, and p+ contact region 332 form photodiode 214 for that die region.

Following the formation of the p+ regions of the electronic circuits, including p+ contact region 332, patterned photoresist layer 330 is removed in a conventional manner, such as with acetone. After this, wafer 310 is cleaned to remove organics, such as with a conventional Piranha etch.

Figure 3F:
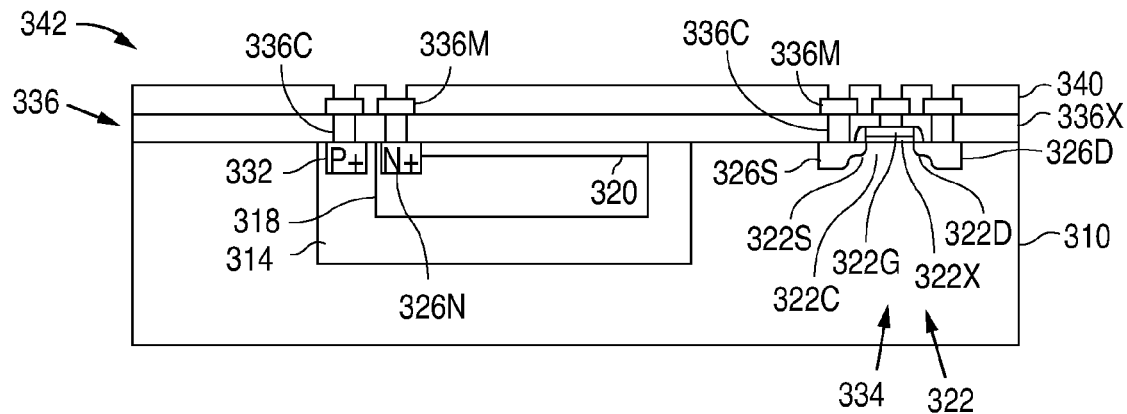

As shown in FIG. 3F, once wafer 310 has been cleaned to remove organics, an interconnect structure 336 is conventionally formed on the top surface of wafer 310. Interconnect structure 336 can be conventionally formed by depositing an oxide layer 336X (after an optional silicidation of the n+ and p+ regions and the polysilicon gates), followed by a mask and etch step to form openings that expose n+ contact region 326N, n+ source 326S, n+ drain region 326D, p+ contact region 332, and the to-be-contacted n+ and p+ regions and polysilicon gates of the devices of the electronic circuit. Following this, a metal layer is deposited, and then planarized to remove the metal layer from the top surface of oxide layer 336X and form contacts 336C in the openings.

After the metal contacts 336C have been formed, a metal layer is deposited and then masked and etched to form a number of metal-1 traces 336M. Following this, a passivation layer 340 is formed to touch oxide layer 336X and the metal-1 traces 336M. Regions of passivation layer 340, which can be implemented with a layer of oxide and an overlying layer of nitride, are removed to expose the bond pad regions of the metal-1 traces 336M. Following this, wafer 310 is diced in a conventional manner to separate the die regions and form a number of photo detector die 342.

Figure 4:
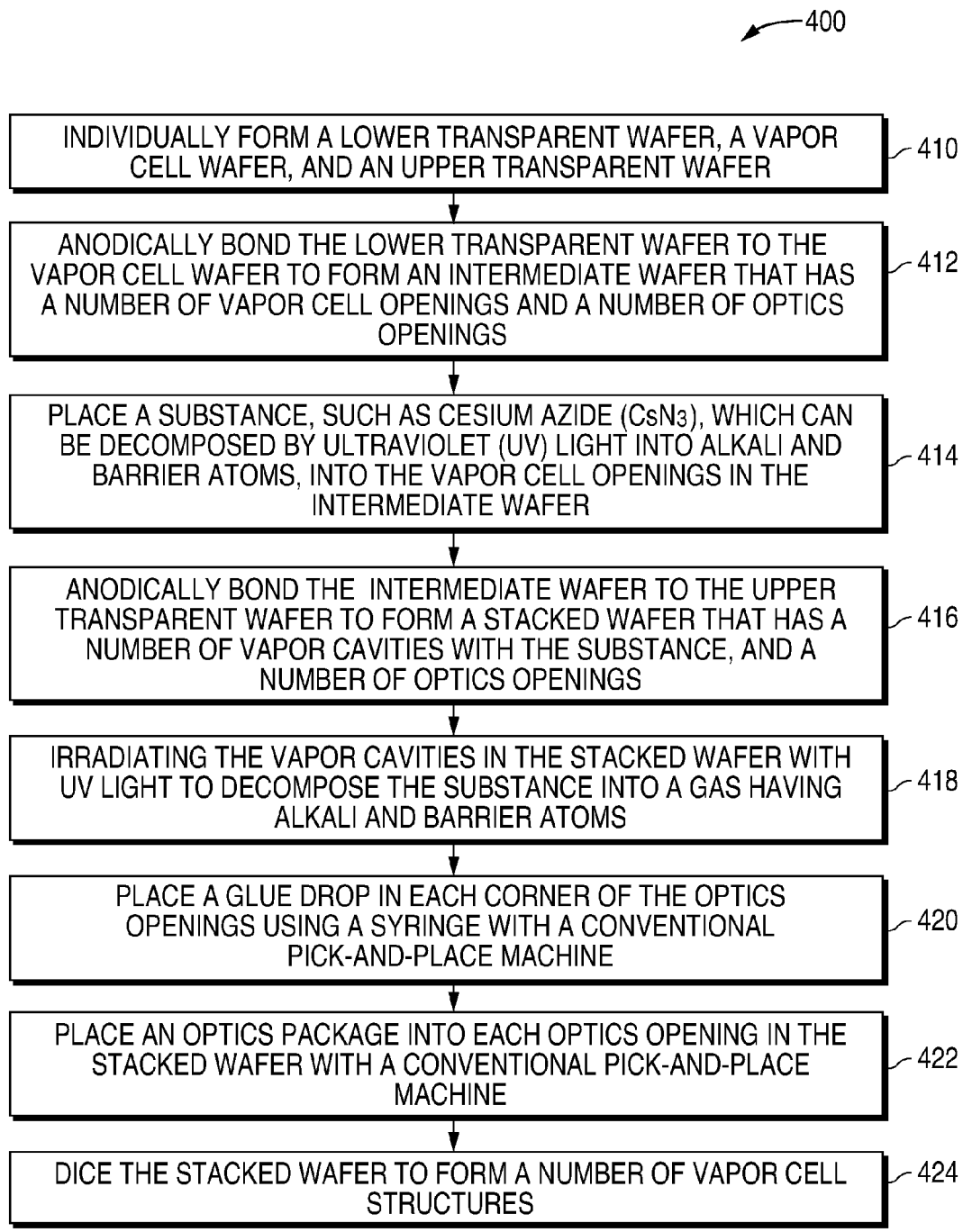
FIG. 4 is a flow chart illustrating an example of a method of forming a vapor cell die in accordance with the present invention.

FIG. 4 shows a flow chart that illustrates an example of a method of forming a vapor cell die in accordance with the present invention. As shown in FIG. 4, the method begins at 410 by individually forming a lower transparent wafer, a vapor cell wafer, and an upper transparent wafer.

Figure 5A:
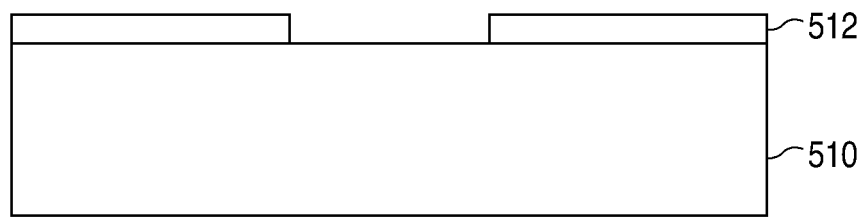
FIGS. 5A-5B are a series of cross-sectional views illustrating an example of a method of forming a lower transparent wafer in accordance with the present invention.
Figure 5B:
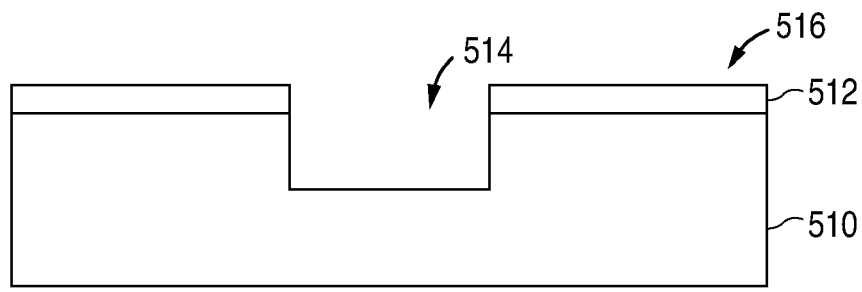

FIGS. 5A-5B show a series of cross-sectional views that illustrate an example of a method of forming a lower transparent wafer in accordance with the present invention. The method utilizes a transparent wafer 510 which is approximately 1 mm thick. For example, Eagle XG® or Pyrex® by Corning and Schott Borofloat® by Schott are glass products that can be utilized.

As shown in FIG. 5A, the method begins by forming a patterned photoresist layer 512 on the top surface of transparent wafer 510 in a conventional manner. Following this, as shown in FIG. 5B, the exposed regions of transparent wafer 510 are etched in a conventional manner for a predetermined period of time to form a number of optics openings 514 in transparent wafer 510.

Wafer 510 has rows and columns of identical die regions (e.g., 5 mm square), and an optics opening 514 is formed in each die region. For simplicity, only one die region is shown in FIGS. 5A-5B. In the present example, each optics opening 514 is approximately 250-400 microns wide. Once the optics openings 514 have been formed, patterned photoresist layer 512 is removed in a conventional manner, such as with acetone, to form a lower transparent wafer 516. Following this, wafer 516 is cleaned to remove organics, such as with a conventional Piranha etch. (Shallow glue channels can be optionally etched into the corners of the optics openings 514 using a mask and etch step.)

Figure 6:
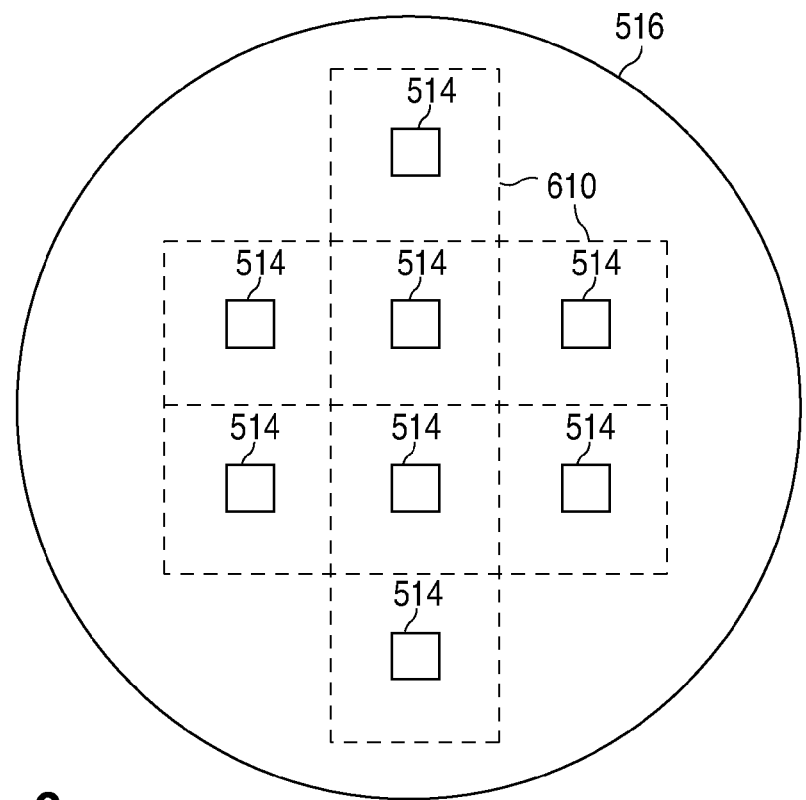
FIG. 6 is a plan view illustrating lower transparent wafer 516 in accordance with the present invention.

FIG. 6 shows a plan view that illustrates lower transparent wafer 516 in accordance with the present invention. As shown in FIG. 6, lower transparent wafer 516 has a large number of die regions 610 that are arranged in rows and columns, and a large number of optics openings 514 where each optics opening 514 is centrally positioned in each die region 610.

FIGS. 7A-7F show a series of cross-sectional views that illustrate an example of a method of forming a vapor cell wafer in accordance with the present invention. In the present example, the method utilizes a conventionally-formed p-type single-crystal silicon wafer 710 approximately 0.725 to 1.00 mm thick. Wafer 710 has rows and columns of identical die regions (e.g., 5 mm square). For simplicity, only one die region is shown in FIGS. 7A-7F.

Figure 7A:
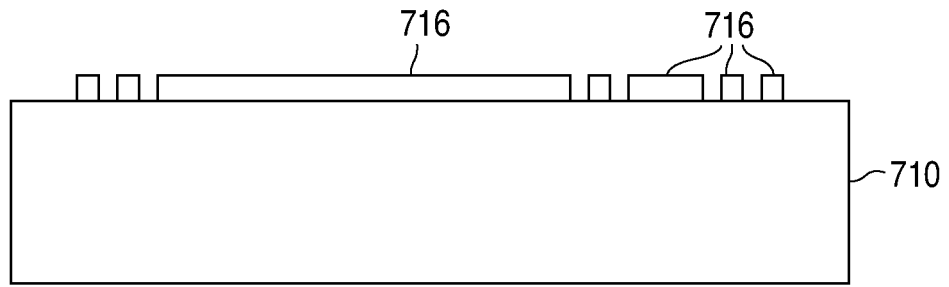
FIGS. 7A-7F are a series of cross-sectional views illustrating an example of a method of forming a vapor cell wafer in accordance with the present invention.
Figure 7B:
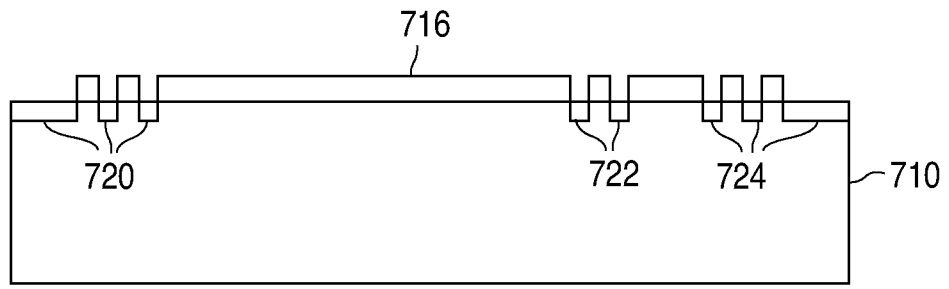

As shown in FIG. 7A, the method begins by forming a patterned photoresist layer 716 on the top surface of wafer 710 in a conventional manner. After patterned photoresist layer 716 has been formed, as shown in FIG. 7B, the exposed regions of wafer 710 are implanted with a dopant, such as phosphorous, to form an n+ resistive heater strip 720, an n+ resistive temperature sensor strip 722, and an n+ resistive heater strip 724 in each die region. (The ends of the n+ strips 720, 722, and 724 can optionally be silicided by depositing a layer of oxide, etching the oxide layer to expose the ends, siliciding the ends, and removing the oxide layer.)

Once the n+ strips 720, 722, and 724 have been formed, patterned photoresist layer 716 is removed in a conventional manner. For example, patterned photoresist layer 716 can be removed with acetone. Following this, wafer 710 is cleaned to remove organics, such as with a conventional Piranha etch.

Figure 7C:
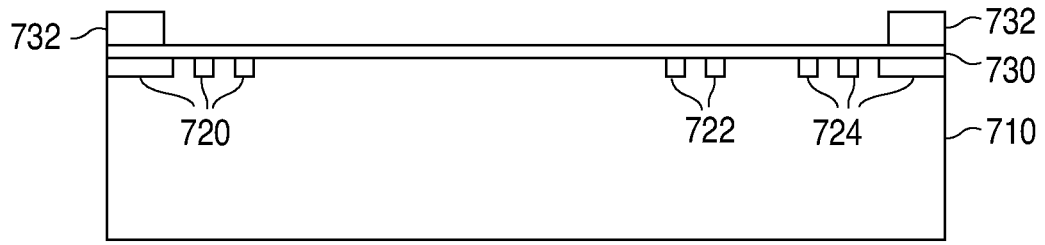

As shown in FIG. 7C, after wafer 710 has been cleaned following the removal of patterned photoresist layer 716, a layer of metal 730, such as aluminum, is deposited to touch wafer 710. After this, a patterned photoresist layer 732 is formed on the top surface of metal layer 730 in a conventional manner.

Figure 7D:
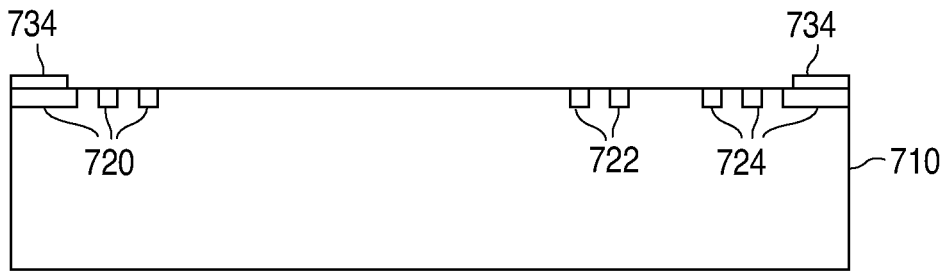

Next, as shown in FIG. 7D, the exposed regions of metal layer 730 are etched to form a number of bond pad structures 734 that touch and lie over the ends of each n+ resistive heater strip 720, n+ resistive temperature sensor strip 722, and n+ resistive heater strip 724. Once the bond pad structures 734 have been formed, patterned photoresist layer 732 is removed in a conventional manner, such as with acetone. Following this, wafer 710 is cleaned to remove organics, such as with a conventional Piranha etch.

Figure 7E:
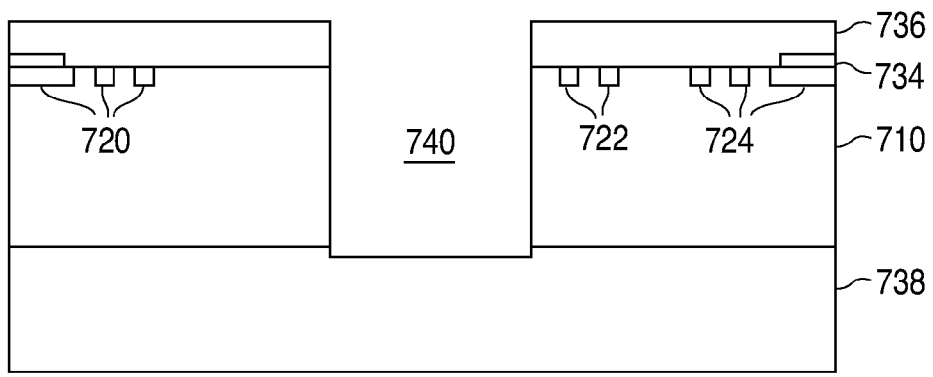

As shown in FIG. 7E, after wafer 710 has been cleaned following the removal of patterned photoresist layer 732, a hard mask 736 is formed on wafer 710, the strips 722 and 724, and the bond pad structures 734 in a conventional manner. For example, hard mask 736 can be formed by sequentially depositing a layer of oxide, a layer of nitride, and a patterned photoresist layer, followed by an etch step that forms openings in the oxide/nitride layers and the removal of the patterned photoresist layer.

After hard mask 736 has been formed, the bottom surface of wafer 710 is temporarily attached to a handle wafer 738 in a conventional manner. For example, a layer of photoresist material, which can be easily removed in a subsequent step, can be utilized to temporarily attach wafer 710 to handle wafer 738.

Following this, the exposed regions of wafer 710 and a portion of underlying handle wafer 738 are etched using a conventional deep reactive ion etch (DRIE), such as a Bosch process, to form a vapor cell opening 740 in each die region. Each vapor cell opening 740, which extends completely through wafer 710, has a substantially vertical side wall surface. In the present example, each vapor cell opening 740 has a width of approximately 1 mm.

An alternative to DRIE would be a wet etch using, e.g., KOH or TMAH, to form the vapor cell openings 740 in wafer 710. In this case, the sidewalls are no longer vertical, but are sloped at 54.7 degrees. In addition, the narrow portion of each vapor cell opening 740 is at the top of wafer 710.

Figure 7F:
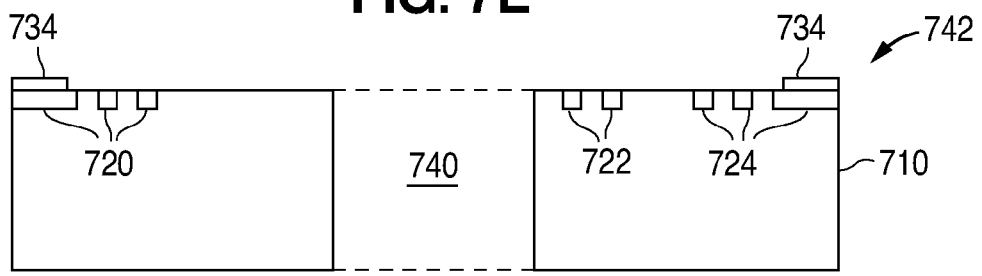

As shown in FIG. 7F, following the etch that forms the vapor cell openings 740 in wafer 710, hard mask 736 and handle wafer 738 are removed in a conventional manner to form a vapor cell wafer 742.

Figure 8:
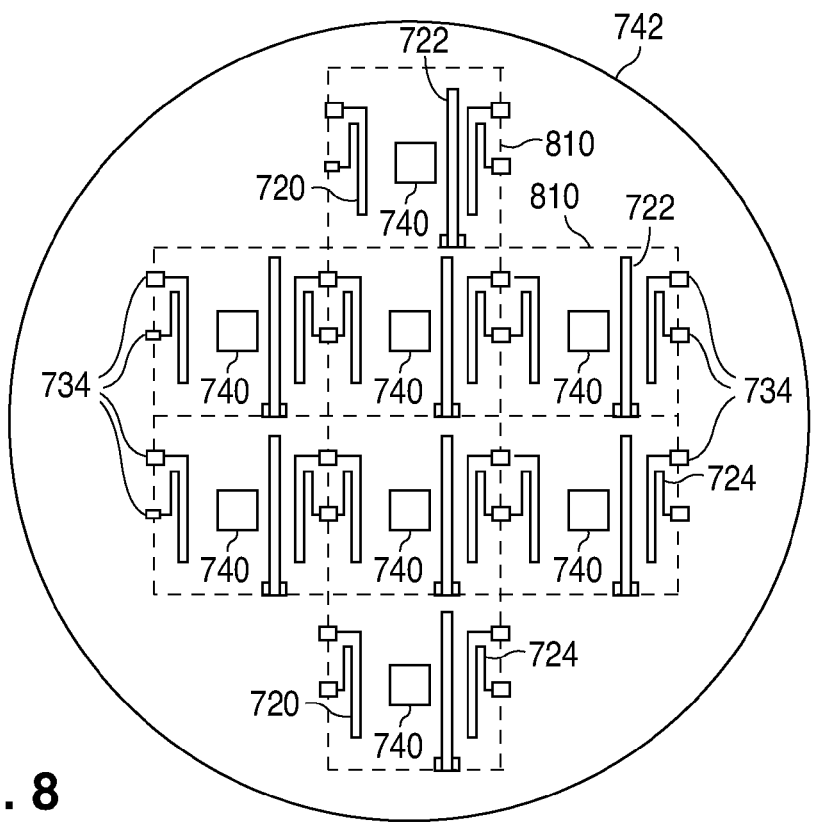
FIG. 8 is a plan view illustrating vapor cell wafer 742 in accordance with the present invention.

FIG. 8 shows a plan view that illustrates vapor cell wafer 742 in accordance with the present invention. As shown in FIG. 8, vapor cell wafer 742 has a large number of die regions 810 arranged in rows and columns that correspond with the die regions 610 of wafer 516, and a number of vapor cell openings 740 where each vapor cell opening 740 is centrally positioned in each die region 810.

As further shown in FIG. 8, the n+ strips 720, 722, and 724 are laid out to minimize the magnetic field that is generated by current flowing through the n+ strips 720, 722, and 724. For example, the n+ strips 720, 722, and 724 can each be laid out in long parallel n+ strips with ends connected together to form a single n+ strip 720, a single n+ strip 722, and a single n+ strip 724.

FIGS. 9A-9I show a series of cross-sectional views that illustrate an example of a method of forming an upper transparent wafer in accordance with the present invention. The method utilizes a conventionally-formed transparent wafer 910 approximately 300 μm thick. For example, transparent wafer 910 can be implemented with glass such as Pyrex® by Corning. Wafer 910 has rows and columns of identical die regions (e.g., 5 mm square). For simplicity, only one die region is shown in FIGS. 9A-9I.

Figure 9A:
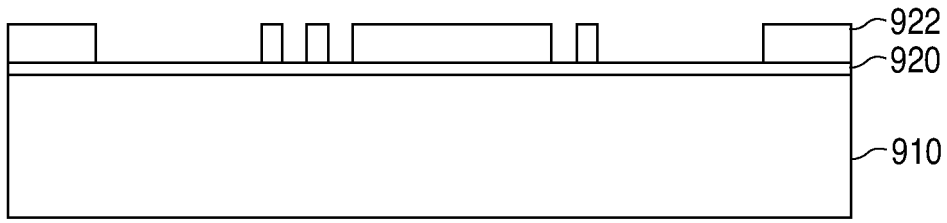
FIGS. 9A-9I are a series of cross-sectional views illustrating an example of a method of forming an upper transparent wafer in accordance with the present invention.

As shown in FIG. 9A, the method begins by forming a seed layer 920 to touch the top surface of transparent wafer 910 in a conventional manner. For example, seed layer 920 can be formed by depositing 300 Å of titanium, 3000 Å of copper, and 300 Å of titanium. Once seed layer 920 has been formed, a plating mold 922 is formed on the top surface of seed layer 920.

Figure 9B:
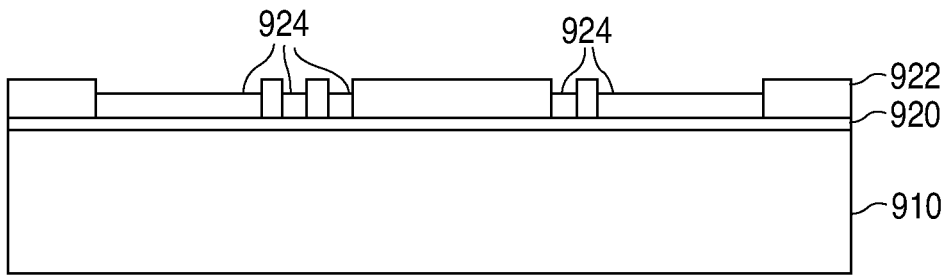
Figure 9C:
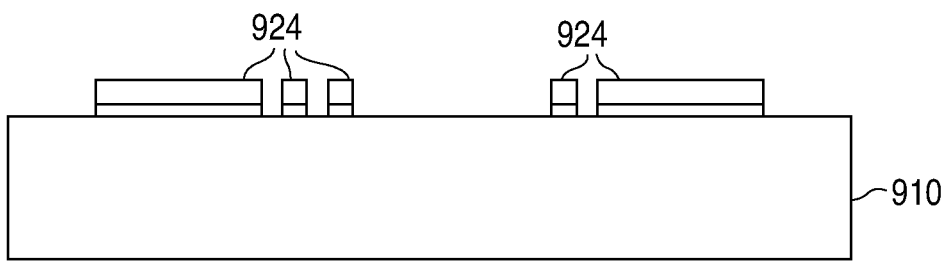

Following the formation of plating mold 922, as shown in FIG. 9B, the top titanium layer is stripped and copper is electroplated to form a number of metal-1 traces 924. As shown in FIG. 9C, after the electroplating, plating mold 922 and the underlying regions of seed layer 920 are removed to expose the metal-1 traces 924.

Figure 9D:
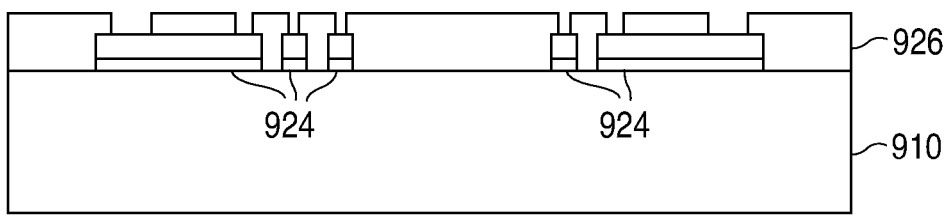

As shown in FIG. 9D, after the metal-1 traces 924 have been formed, a non-conductive layer 926 is formed to touch the top surface of transparent wafer 910 and the metal-1 traces 924. Non-conductive layer 926 can be formed in a number of ways. For example, non-conductive layer 926 can be implemented with a layer of oxide and an overlying layer of nitride, followed by a mask and etch to expose the bond pad regions of the metal-1 traces 924.

Alternately, a polymer layer, such as SU-8 (which is a negative photoresist), can be deposited, exposed with a pattern, and then cured to form non-conductive layer 926. The pattern forms a number of openings in non-conductive layer 926, including openings that expose the bond pad regions of the metal-1 traces 924.

Figure 9E:
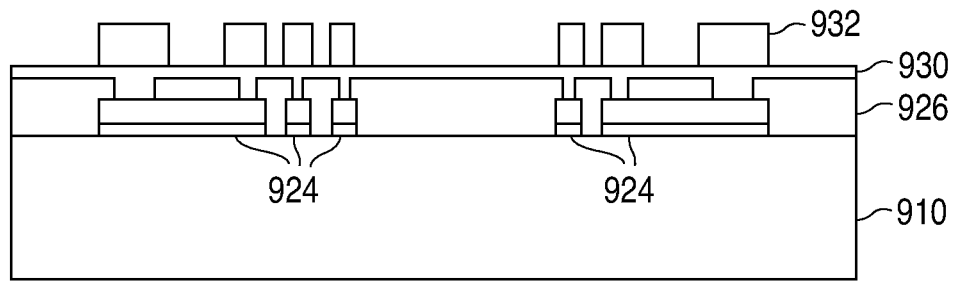

Following this, as shown in FIG. 9E, a bonding metallic layer 930, such as aluminum, is deposited to touch non-conductive layer 926 and the bond pad regions of the metal-1 traces 924. Next, a patterned photoresist layer 932 is formed on the top surface of bonding metallic layer 930 in a conventional manner.

Figure 9F:
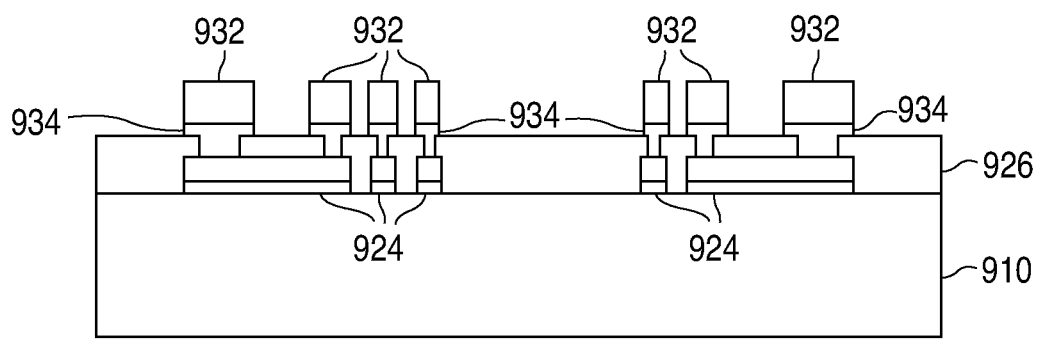

After patterned photoresist layer 932 has been formed, as shown in FIG. 9F, the exposed regions of bonding metallic layer 930 are etched in a conventional manner to expose the top surface of non-conductive layer 926 and form a number of bond pad structures 934. After the bond pad structures 934 have been formed, patterned photoresist layer 932 is removed in a conventional manner, such as with acetone. Following this, non-conductive layer 926 and the bond pad structures 934 are cleaned to remove organics, such as with a conventional Piranha etch.

Figure 9G:
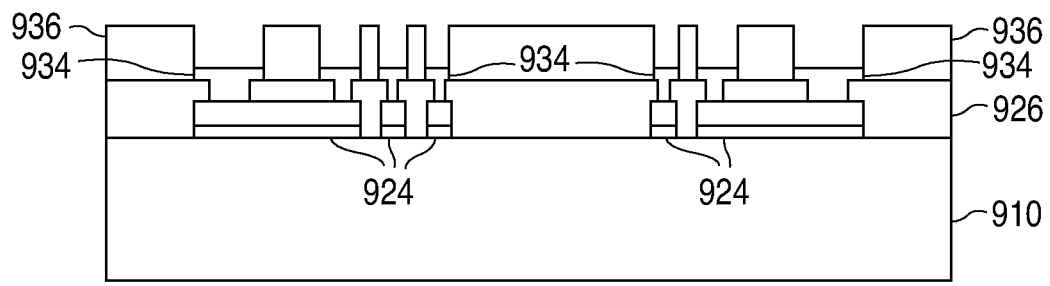

As shown in FIG. 9G, after cleaning to remove organics following the removal of patterned photoresist layer 932, a passivation layer 936 is formed to touch the top surface of non-conductive layer 926 and the bond pad structures 934. Passivation layer 936 can be formed in a number of ways. For example, passivation layer 936 can be implemented with a layer of oxide and an overlying layer of nitride, followed by a mask and etch to expose regions of the bond pad structures 934.

Alternately, a polymer layer, such as SU-8, can be deposited, exposed with a pattern, and then cured to form passivation layer 936. The pattern forms a number of openings in passivation layer 936, including openings that expose regions of the bond pad structures 934. Non-conductive layer 926 and passivation layer 936, which provide a number of benefits such as moisture resistance and stress relief, can optionally be omitted.

Figure 9H:
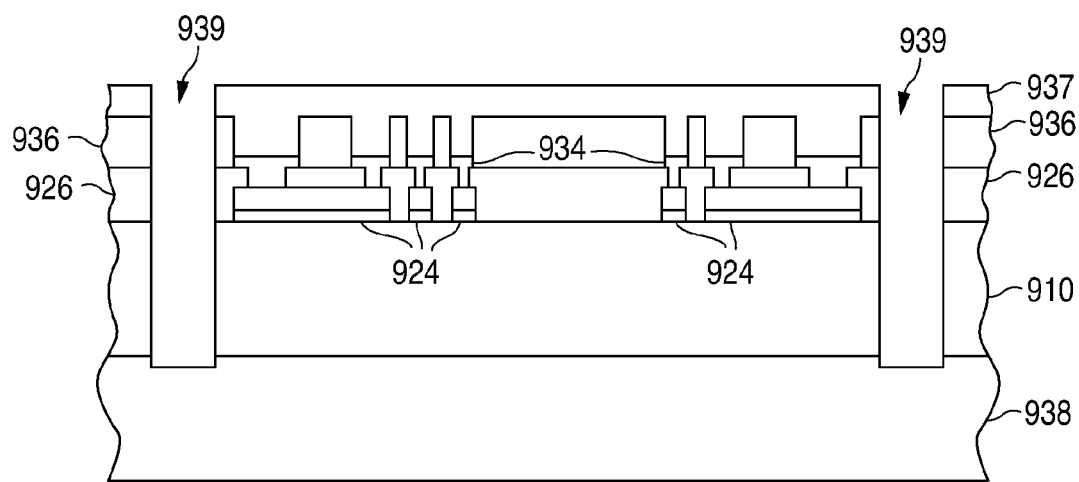

As shown in FIG. 9H, after passivation layer 936 has been formed, a hard mask 937 is formed on passivation layer 936 and the bond pad structures 934 in a conventional manner. For example, hard mask 937 can be formed by sequentially depositing a layer of oxide, a layer of nitride, and a patterned photoresist layer, followed by an etch step that forms openings in the oxide/nitride layers and the removal of the patterned photoresist layer.

After hard mask 937 has been formed, the bottom surface of wafer 910 is temporarily attached to a handle wafer 938 in a conventional manner. For example, a layer of photoresist material, which can be easily removed at a subsequent step, can be utilized to temporarily attach wafer 910 to handle wafer 938.

Following this, the exposed regions of transparent wafer 910 are etched in a conventional manner, such as with a wet etch or sandblast process, to form a number of through-the-wafer openings 939 in each die region that extend completely through transparent wafer 910. The through-the-wafer openings 939 must be wide enough to accommodate the bond wire sweep (the angled attachment of a bond wire) and the minimum bond pad to bond pad horizontal spacing.

Figure 9I:
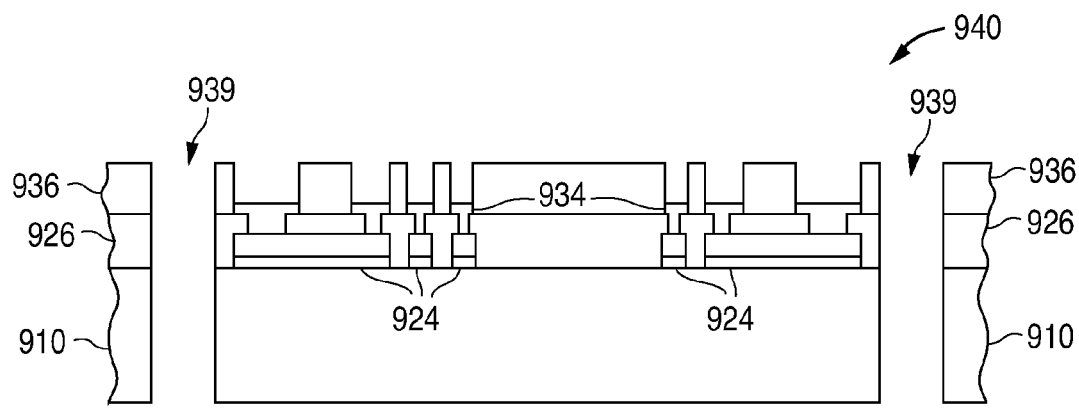

As shown in FIG. 9I, following the etch that forms the through-the-wafer openings 939, hard mask 937 and handle wafer 938 are removed in a conventional manner to form an upper transparent wafer 940. (In addition, a thick patterned photoresist layer can alternately be used in lieu of hard mask 937).

Figure 10:
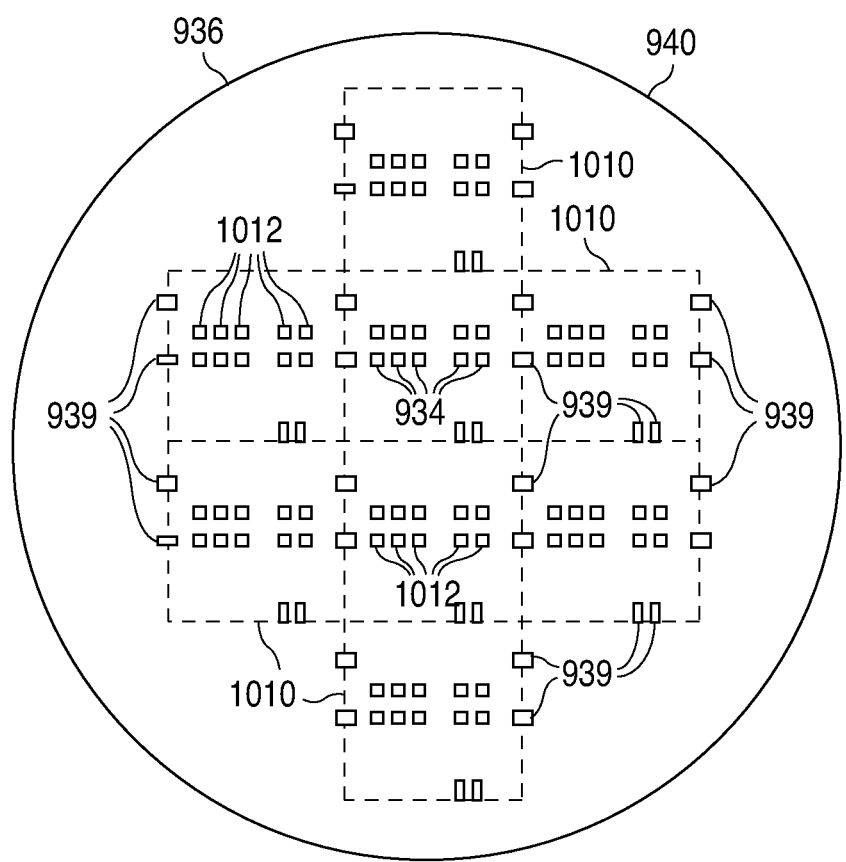
FIG. 10 is a plan view illustrating upper transparent wafer 940 in accordance with the present invention.

FIG. 10 shows a plan view that illustrates upper transparent wafer 940 in accordance with the present invention. As shown in FIG. 10, upper transparent wafer 940 has a number of identical die regions 1010 (e.g., 5 mm square) arranged in rows and columns which correspond with the die regions 810 of vapor cell wafer 742 and the die regions 610 of lower transparent wafer 516. In addition, transparent wafer 910 has a number of through-the-wafer openings 939 around the periphery of each die region 1010, and a number of bond pad openings 1012 that expose the bond pad structures 934.

Referring again to FIG. 4, after the lower transparent wafer, the vapor cell wafer, and the upper transparent wafer have been individually formed, method 400 moves to 412 to anodically bond the lower transparent wafer to the vapor cell wafer to form an intermediate wafer. The anodic bonding is performed in a conventional manner at a standard temperature and voltage, such as 400° C. and 1000V, in a noble gas environment, such as nitrogen gas.

Figure 11:
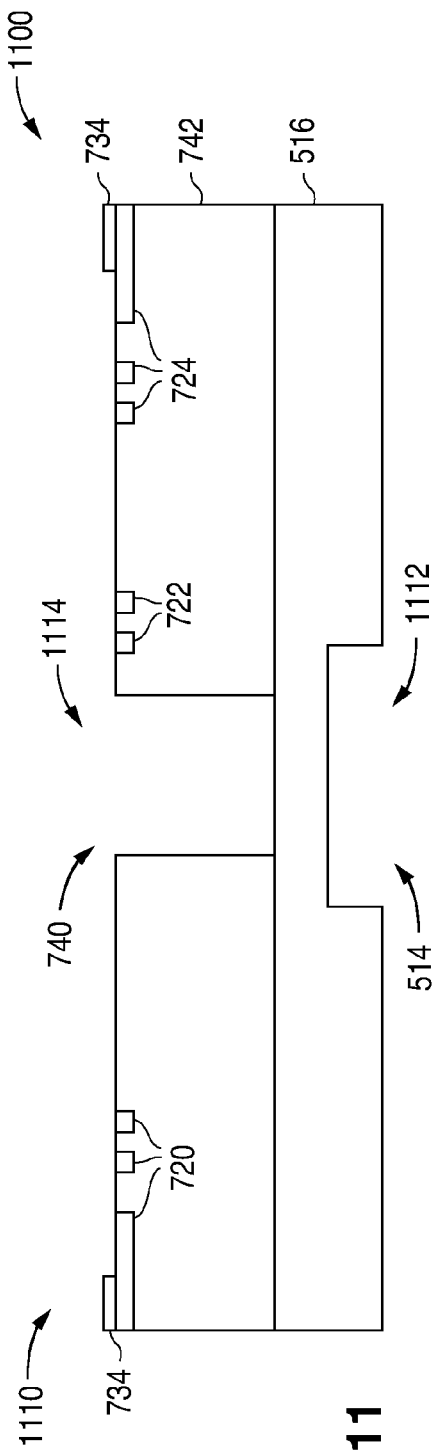
FIG. 11 is a cross-sectional view illustrating an example of an intermediate wafer 1100 in accordance with the present invention.

FIG. 11 shows a cross-sectional view that illustrates an example of an intermediate wafer 1100 in accordance with the present invention. As shown in FIG. 11, intermediate wafer 1100, which can result from anodically bonding lower transparent wafer 516 to vapor cell wafer 742, has a number of die regions 1110 arranged in rows and columns which correspond with the die regions 810 of vapor cell wafer 742 and the die regions 610 of lower transparent wafer 516. For simplicity, only one die region 1110 is shown in FIG. 11.

As further shown in FIG. 11, intermediate wafer 1100 has a number of optics openings 1112 that correspond with the optics openings 514, and a corresponding number of vapor cell openings 1114 that correspond with the vapor cell openings 740. The optics opening 1112 and the vapor cell opening 1114 in each die region 1110 are vertically aligned.

Referring back to FIG. 4, after the lower transparent wafer has been anodically bonded to the vapor cell wafer to form the intermediate wafer, method 400 moves to 414 to place a substance, such as cesium azide ($CsN_3$), which can be decomposed by ultraviolet (UV) light into alkali and barrier atoms, into the vapor cell openings of the intermediate wafer.

For example, cesium azide can be placed in the vapor cell openings in the intermediate wafer by dissolving cesium azide into water to form an aqueous solution, placing a measured amount of the solution (e.g., 10 μL) into each vapor cell opening of the intermediate wafer at room temperature using, for example, micro-pipettes, and then heating the intermediate wafer to evaporate away the water and leave a cesium azide powder.

After the substance has been placed into the vapor cell openings of the intermediate wafer, method 400 moves to 416 to anodically bond the intermediate wafer to the upper transparent wafer to form a stacked wafer that has a number of vapor cavities with the substance, and a number of optics openings. Cesium azide is unstable at 400° C., and diffuses into glass at 350° C. As a result, the anodic bonding is performed in a conventional manner at a reduced temperature, such as 300° C., and in a noble gas environment, such as nitrogen gas, with increased bonding time. A reduced temperature requires a higher voltage. However, a thinner wafer requires a lower voltage. As a result, a standard voltage of 1000V can also be used.

Figure 12:
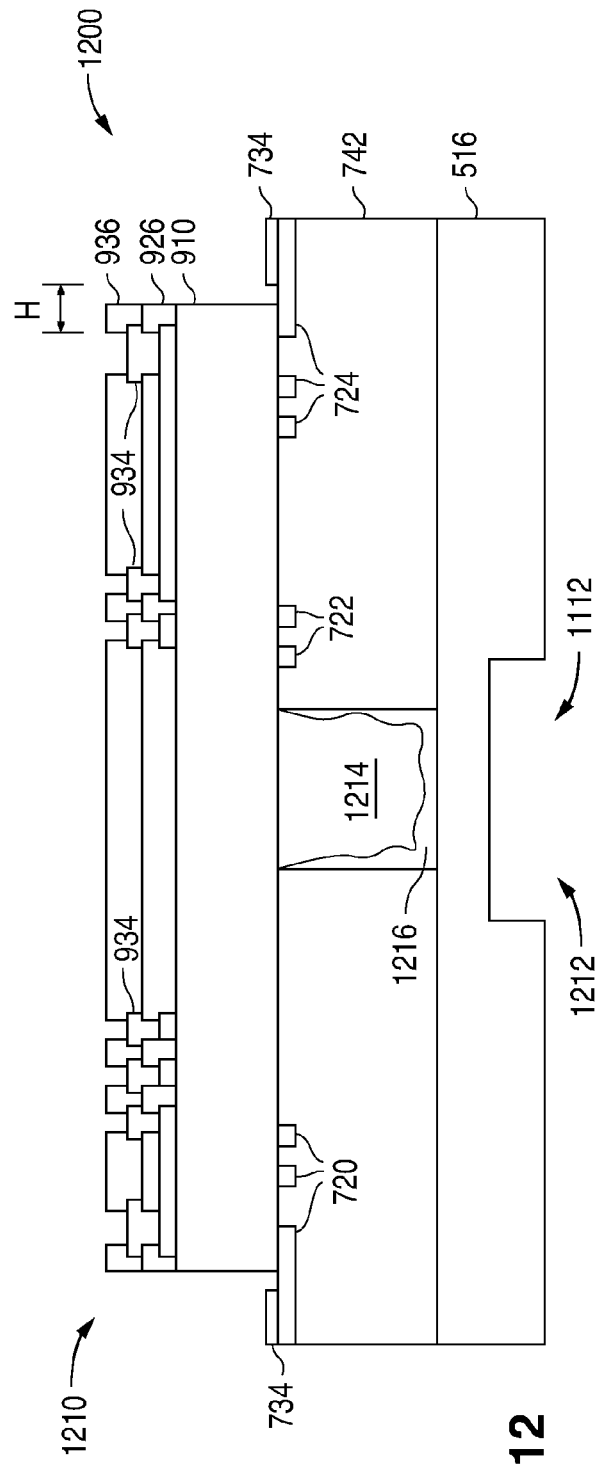
FIG. 12 is a cross-sectional view illustrating a stacked wafer 1200 in accordance with the present invention.

FIG. 12 shows a cross-sectional view that illustrates a stacked wafer 1200 in accordance with the present invention. As shown in FIG. 12, stacked wafer 1200, which can result from anodically bonding upper transparent wafer 940 to intermediate wafer 1100, has a number of die regions 1210 arranged in rows and columns which correspond with the die regions 1110 of intermediate wafer 1100 and the die regions 1010 of transparent wafer 910. For simplicity, only one die region 1210 is shown in FIG. 12.

As further shown in FIG. 12, stacked wafer 1200 has a number of optics openings 1212 that correspond with the optics openings 1112, and a corresponding number of hermetically sealed vapor cell cavities 1214 that result from closing the vapor cell openings 1114. The optics opening 1212 and the vapor cell cavity 1214 in each die region 1210 are vertically aligned. In addition, a substance 1216, such as a cesium azide powder, is hermetically sealed within each vapor cell cavity 1214. Further, the minimum bond pad to bond pad horizontal spacing H for a 175 μm thick die is approximately 375-500 μm.

Referring back to FIG. 4, after the intermediate wafer has been anodically bonded to the upper transparent wafer to form the stacked wafer, method 400 moves to 418 to irradiate the stacked wafer with UV light for approximately 10 or more hours at room temperature, which decomposes the substance into a gas having cesium (alkali) and barrier atoms. Each cavity 1214 should have approximately $10^{12}$-$10^{13}$ cesium atoms per cubic centimeter following the irradiation.

If nitrogen atoms are used as barrier atoms, insufficient nitrogen atoms are present, and the noble gas used during bonding is nitrogen, then the anodic bonding can take place under pressure to increase the number of nitrogen atoms. The maximum pressure is limited, however, as too many nitrogen atoms degrades the signal (widens the line width of the wavelength that represents the point of absorption by the outer electrons).

After a gas has been formed in each vapor cavity, method 400 moves to 420 to place a glue drop in each corner of each optics opening using a syringe with a conventional pick-and-place machine. Following this, method 400 moves to 422 to place an optics package, such as optics package 250, into each optics opening in the stacked wafer with a conventional pick-and-place machine.

Conventional pick-and-place machines can process die with a minimum die size of approximately 200 µm, and have an opening side wall-to-die side wall tolerance of approximately 50 µm. After the optics package has been placed into each optics opening and attached by way of the glue drops, method 400 moves to 424 to dice the stacked wafer to form a number of vapor cell die.

Figure 13:
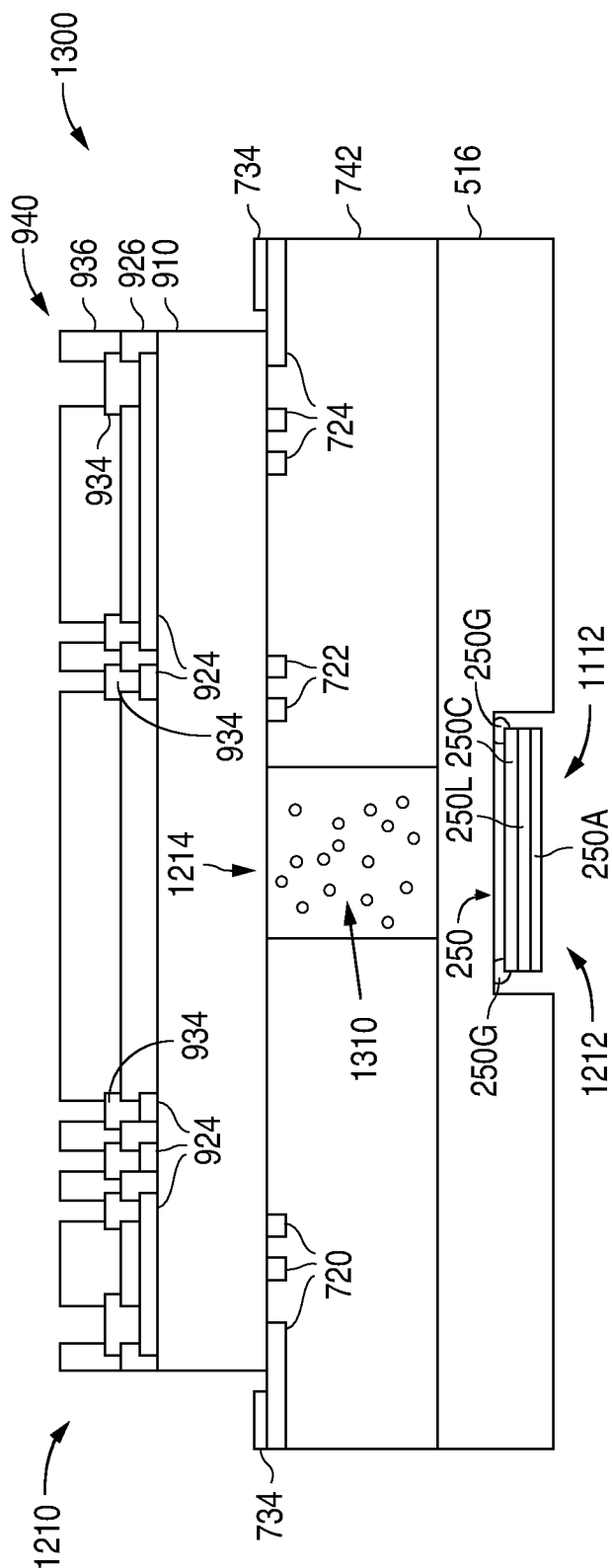
FIG. 13 is a cross-sectional view illustrating an example of a vapor cell die 1300 in accordance with the present invention.

FIG. 13 shows a cross-sectional view that illustrates an example of a vapor cell die 1300 in accordance with the present invention. As shown in FIG. 13, vapor cell die 1300 is formed by dicing stacked wafer 1200 so that the wafer saw passes through the bond pad openings 914 of upper transparent wafer 940. As a result, as further shown in FIG. 13, the dicing exposes the bond pads structures 734, thereby making the bond pad structures 734 available for subsequent wire bonding. As further shown in FIG. 13, a gas 1310 lies within the vapor cell cavity 1214 of each vapor cell die 1300.

Figure 14A:
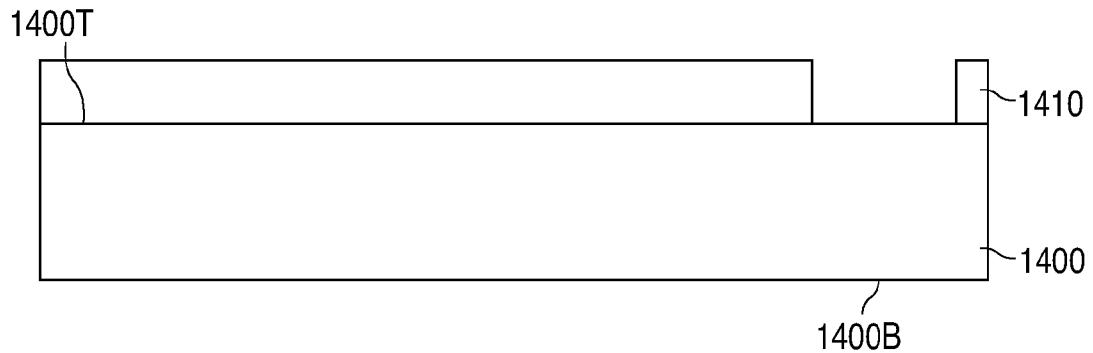
FIGS. 14A-14N are a series of cross-sectional views illustrating an example of a method of forming a base die in accordance with the present invention.
Figure 14B:
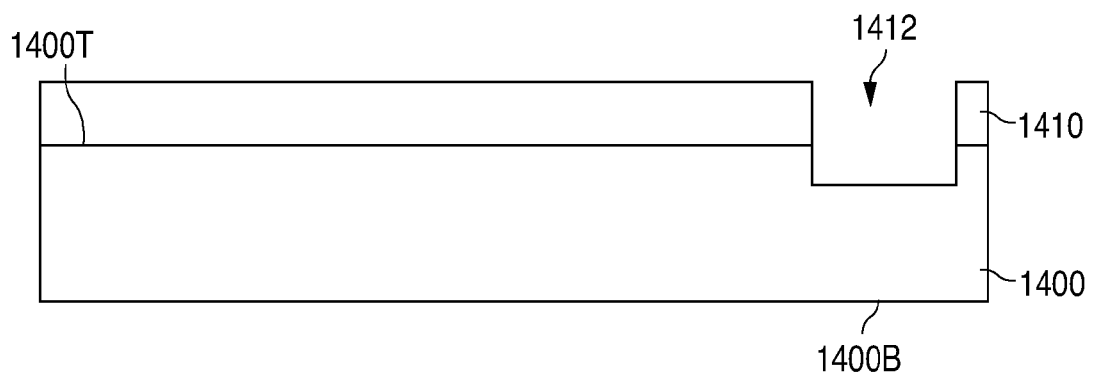
Figure 14C:
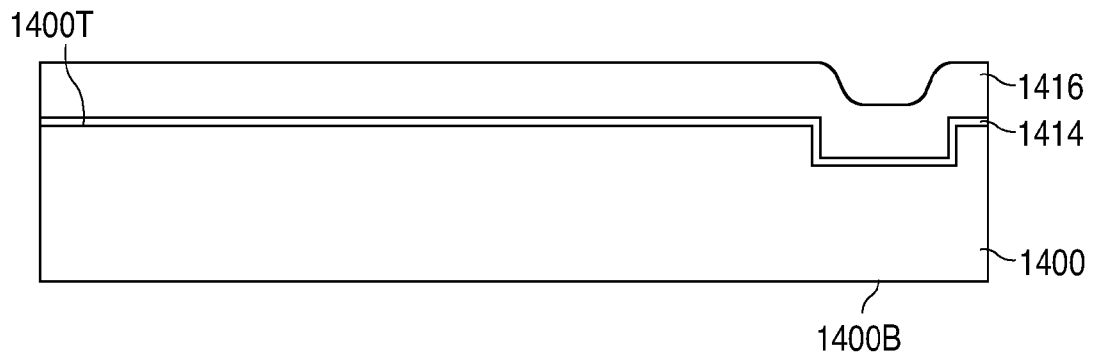
Figure 14D:
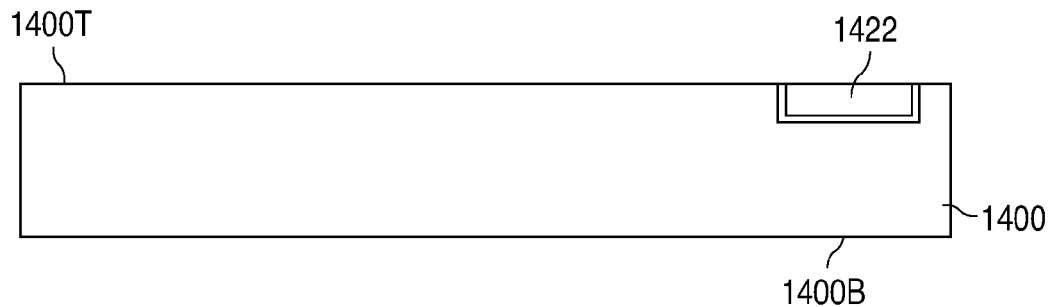
Figure 14E:
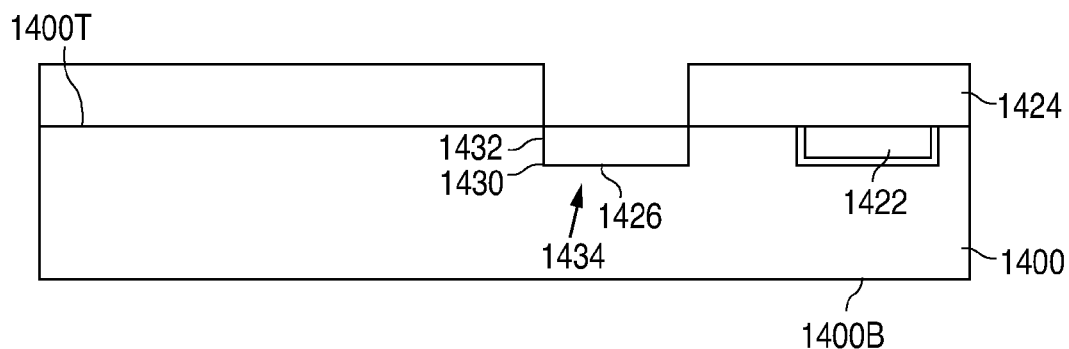
Figure 14F:
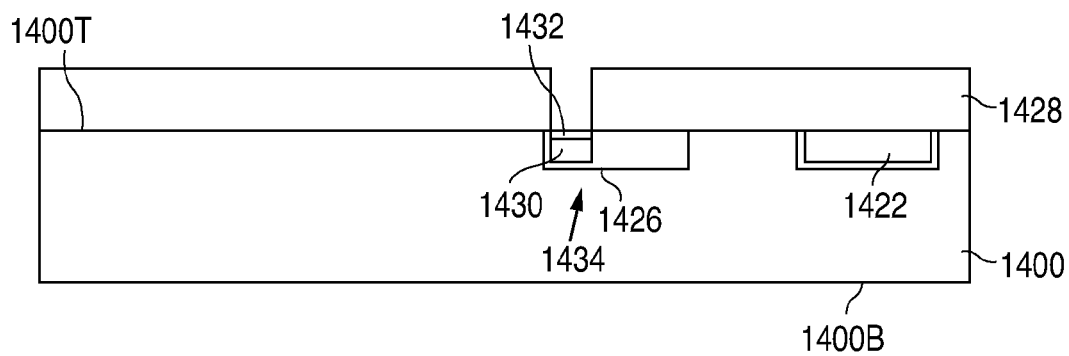
Figure 14G:
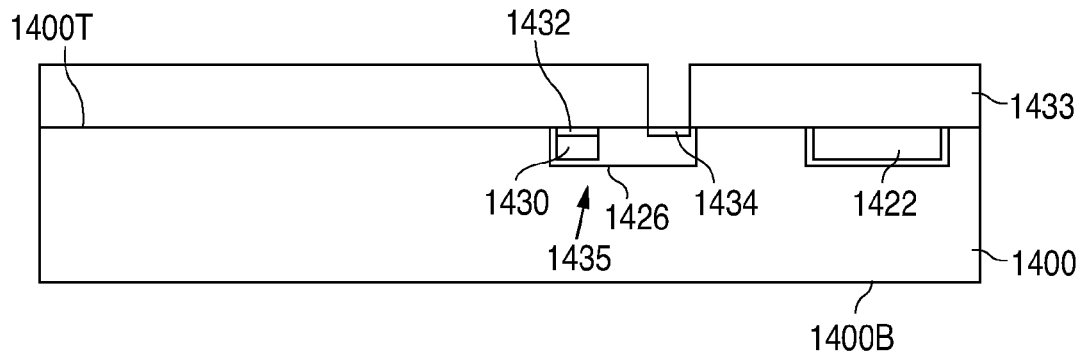
Figure 14H:
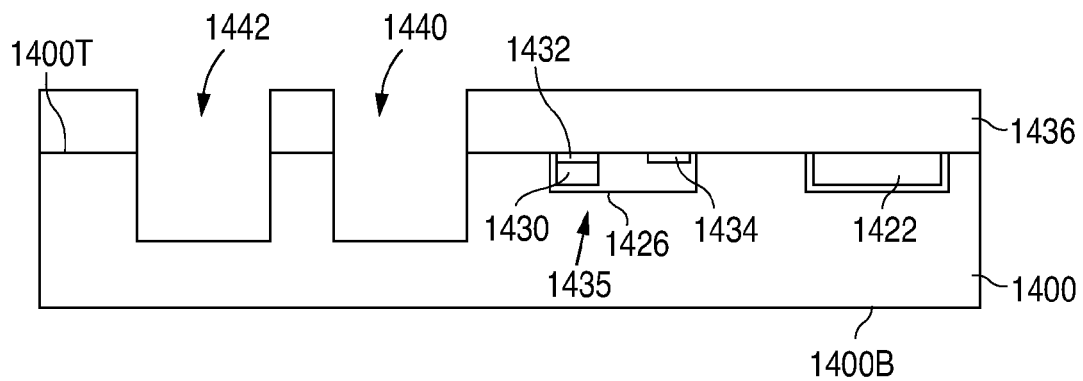
Figure 14I:
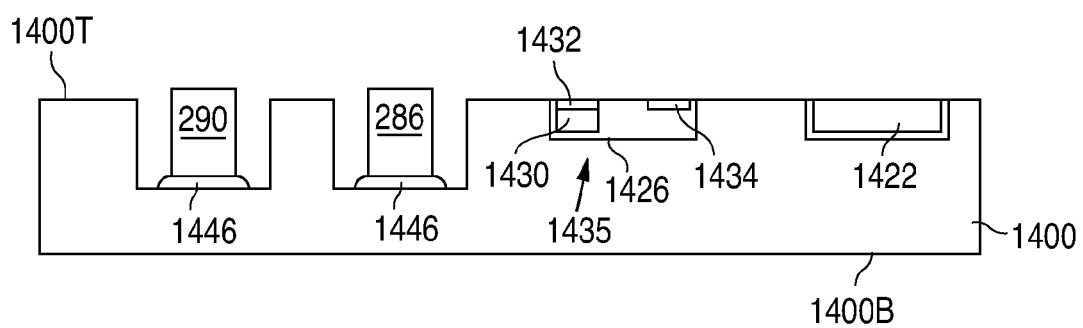
Figure 14J:
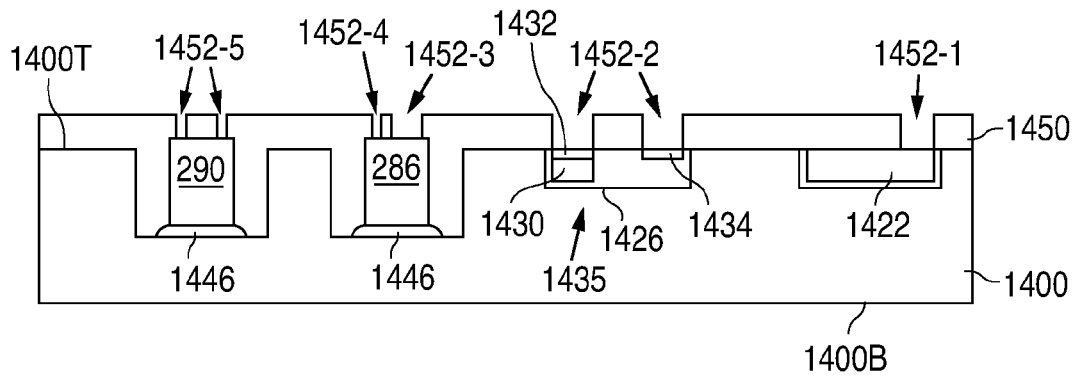
Figure 14K:
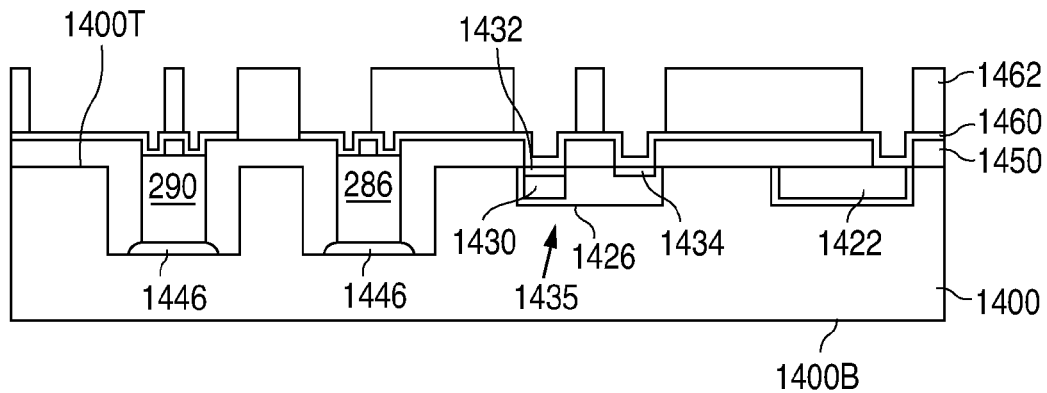
Figure 14L:
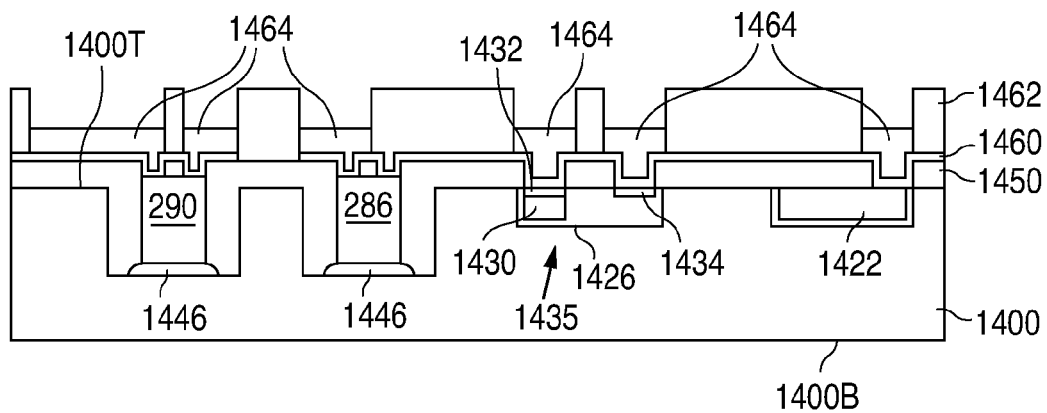
Figure 14M:
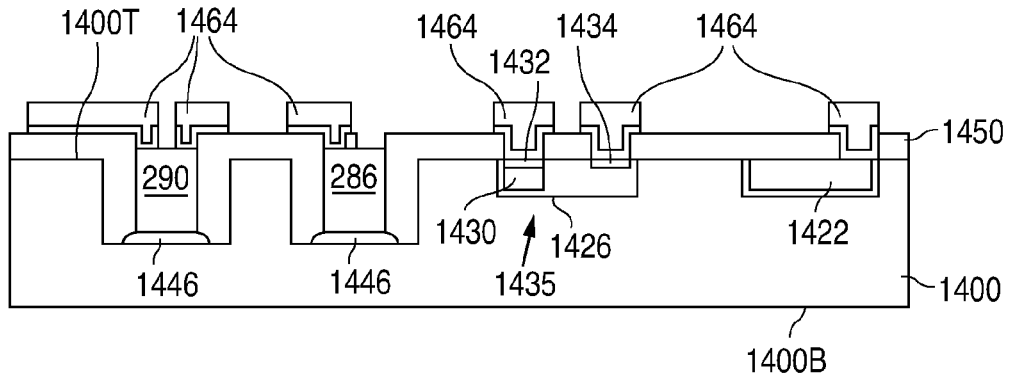
Figure 14N:
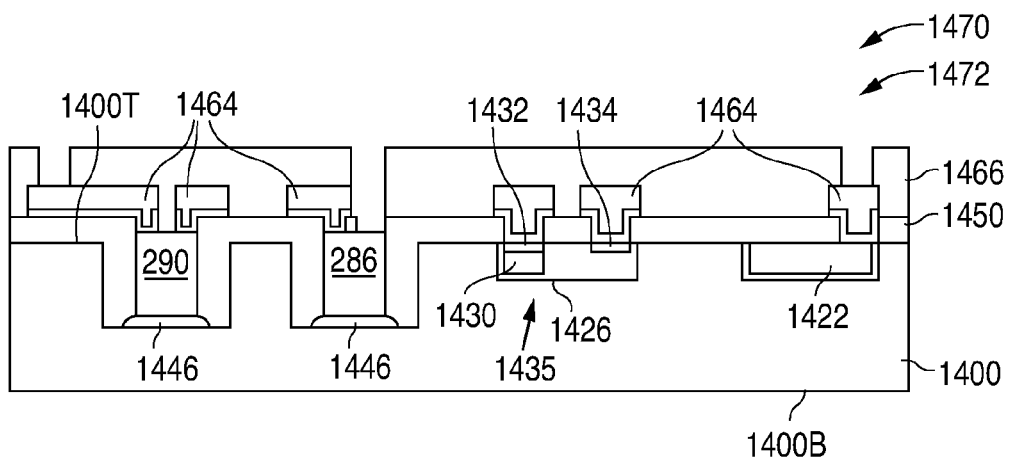

FIGS. 14A-14N show a series of cross-sectional views that illustrate an example of a method of forming a base die in accordance with the present invention. As shown in FIG. 14A, the method utilizes a conventionally formed p- single-crystal silicon wafer 1400 that has a top surface 1400T and a bottom surface 1400B. In the present example, wafer 1400 is polished on only one side.

As further shown in FIG. 14A, the method begins by forming a patterned photoresist layer 1410 on the top side 1400T of wafer 1400 in a conventional manner. Following this, as shown in FIG. 14B, the exposed regions of wafer 1400 are etched for a predetermined period of time to form a number of channels 1412. Wafer 1400 has rows and columns of identical die regions, and a channel 1412 is formed in each die region. For simplicity, only one die region is shown in FIGS. 14A-14N.

Each channel 1412 is laid out to minimize the magnetic field that is generated by current flowing within the channel 1412. For example, each channel 1412 can each be laid out in long parallel strips with alternate ends connected together to form a serpentine pattern. Once the channels 1412 have been formed, patterned photoresist layer 1410 is removed in a conventional manner, such as with acetone. After this, wafer 1400 is cleaned to remove organics, such as with a conventional Piranha etch.

Following this, as shown in FIG. 14C, an oxide layer 1414 is formed on the top surface 1400T of wafer 1400 to line the channels 1412, followed by the deposition of an undoped polysilicon layer 1416. Polysilicon layer 1416 is deposited to a depth that fills the channels 1412. As shown in FIG. 14D, once polysilicon layer 1416 has been formed, polysilicon layer 1416 is planarized until the top surface of wafer 1400 is exposed to form a heating element 1422 which can implement heating element 280.

Next, as shown in FIG. 14E, a patterned photoresist layer 1424 is formed on the top surface 1400T of wafer 1400 and on heating element 1422. After patterned photoresist layer 1424 has been formed, the exposed regions of p-type wafer 1400 are implanted with a p-type dopant, such as boron, and then driven in to form a p- well 1426. P- well 1426 has a dopant concentration that is greater than the dopant concentration of p-wafer 1400. Once p- well 1426 has been formed, patterned photoresist layer 1424 is removed in a conventional manner, such as with acetone. Following this, wafer 1400 is cleaned to remove organics, such as with a conventional Piranha etch.

As shown in FIG. 14F, after wafer 1400 has been cleaned to remove organics, a patterned photoresist layer 1428 is formed on p- single-crystal silicon wafer 1400 in a conventional manner. After patterned photoresist layer 1428 has been formed, the exposed regions of p- single-crystal silicon wafer 1400 are implanted with an n-type material, such as phosphorous, at a lower implant energy, and driven in to form an n-type region 1430 in each p- well 1426.

In the present example, an n-type dopant is next implanted at a lower implant energy, and driven in to form an n+ contact region 1432 that touches n-type region 1430. After n+ contact region 1432 has been formed, patterned photoresist layer 1428 is removed in a conventional manner, such as with acetone. Following this, wafer 1400 is cleaned to remove organics, such as with a conventional Piranha etch.

As shown in FIG. 14G, after wafer 1400 has been cleaned to remove organics, a patterned photoresist layer 1433 is formed on p- single-crystal silicon wafer 1400 in a conventional manner. After patterned photoresist layer 1433 has been formed, the exposed regions of p- single-crystal silicon wafer 1400 are implanted with a p-type material, such as boron, and driven in to form a p+ contact region 1434 that touches p- well 1426, and a temperature sensing diode 1435 which can implement temperature sensor 282. Patterned photoresist layer 1433 is then removed in a conventional manner, such as with acetone. Following this, wafer 1400 is cleaned to remove organics, such as with a conventional Piranha etch.

As shown in FIG. 14H, after the removal of patterned photoresist layer 1433, a patterned photoresist layer 1436 is formed on the top surface 1400T of wafer 1400, heating element 1422, and diode 1435 in a conventional manner. After patterned photoresist layer 1436 has been formed, the exposed regions of p- wafer 1400 are etched for a predetermined period of time to form a first opening 1440 and a second opening 1442.

Patterned photoresist layer 1436 is then removed in a conventional manner, such as with acetone. Following this, wafer 1400 is cleaned to remove organics, such as with a conventional Piranha etch. Rather than being formed at the same time, the first and second openings 1440 and 1442 can be formed in separate mask and etch steps if the first and second openings 1440 and 1442 require different depths.

Following this, as shown in FIG. 14I, a number of glue drops 1446 are inserted into the first and second openings 1440 and 1442 using a syringe with a conventional pick-and-place machine. Following this, VCSEL 286 and integrated circuit 290 are placed into opening 1440 and opening 1442, respectively, with a conventional pick-and-place machine, and attached to opening 1440 and opening 1442, respectively, by way of the glue drops 1446.

As shown in FIG. 14J, after VCSEL 286 and integrated circuit 290 have been placed into and attached to opening 1440 and opening 1442, respectively, a polymer layer, such as SU-8, is formed to touch the top surface 1400T of wafer 1400, fill up the remaining areas of the openings 1440 and 1442, and lie over VCSEL 286 and integrated circuit 290.

The polymer layer is then exposed with a pattern and cured to form a substantially planar non-conductive structure 1450. The pattern forms a number of openings in non-conductive structure 1450, including a heating element opening 1452-1, temperature sensor diode openings 1452-2, a laser opening 1452-3 for the light output by VCSEL 286, a number of first operating openings 1452-4 that expose the external pads of VCSEL 286, and a number of second operating openings 1452-5 that expose the external pads of integrated circuit 290.

As shown in FIG. 14K, after non-conductive structure 1450 has been formed, a seed layer 1460 is deposited to touch non-conductive structure 1450 and the exposed regions of heating element 1422, n+ contact region 1432, p+ contact region 1434, the external pads of VCSEL 286, and the external pads of integrated circuit 290. For example, seed layer 1460 can be formed by depositing 300 Å of titanium, 3000 Å of copper, and 300 Å of titanium. Once seed layer 1460 has been formed, a plating mold 1462 is formed on the top surface of seed layer 1460.

As shown in FIG. 14L, following the formation of plating mold 1462, the top titanium layer is stripped and copper is electroplated to form a number of metal-1 traces 1464. As shown in FIG. 14M, after the electroplating, plating mold 1462 and the underlying regions of seed layer 1460 are removed to expose the metal-1 traces 1464.

As shown in FIG. 14N, after the metal-1 traces 1464 have been formed, a passivation layer 1466 is formed on non-conductive structure 1450 and the metal-1 traces 1464. Passivation layer 1466 can be formed in a number of ways. For example, passivation layer 1466 can be implemented with a layer of oxide and an overlying layer of nitride, followed by an etch to expose the laser light opening of VCSEL 286 and the regions of the metal-1 traces 1464 that function as bond pads.

Alternately, a polymer layer, such as SU-8, can be deposited, exposed with a pattern, and then cured to form passivation layer 1466. The pattern forms a number of openings in passivation layer 1466, including an opening that exposes the laser light opening of VCSEL 286 and the regions of the metal-1 traces 1464 that function as bond pads.

As shown in FIG. 14N, the formation of passivation layer 1466 forms a base wafer 1470. (Shallow glue channels can be optionally etched in the top surface of passivation layer 1466 using a mask and etch step.) Following this, base wafer 1470 is diced in a conventional manner to separate the die regions and form a number of base die 1472.

Figure 15A:
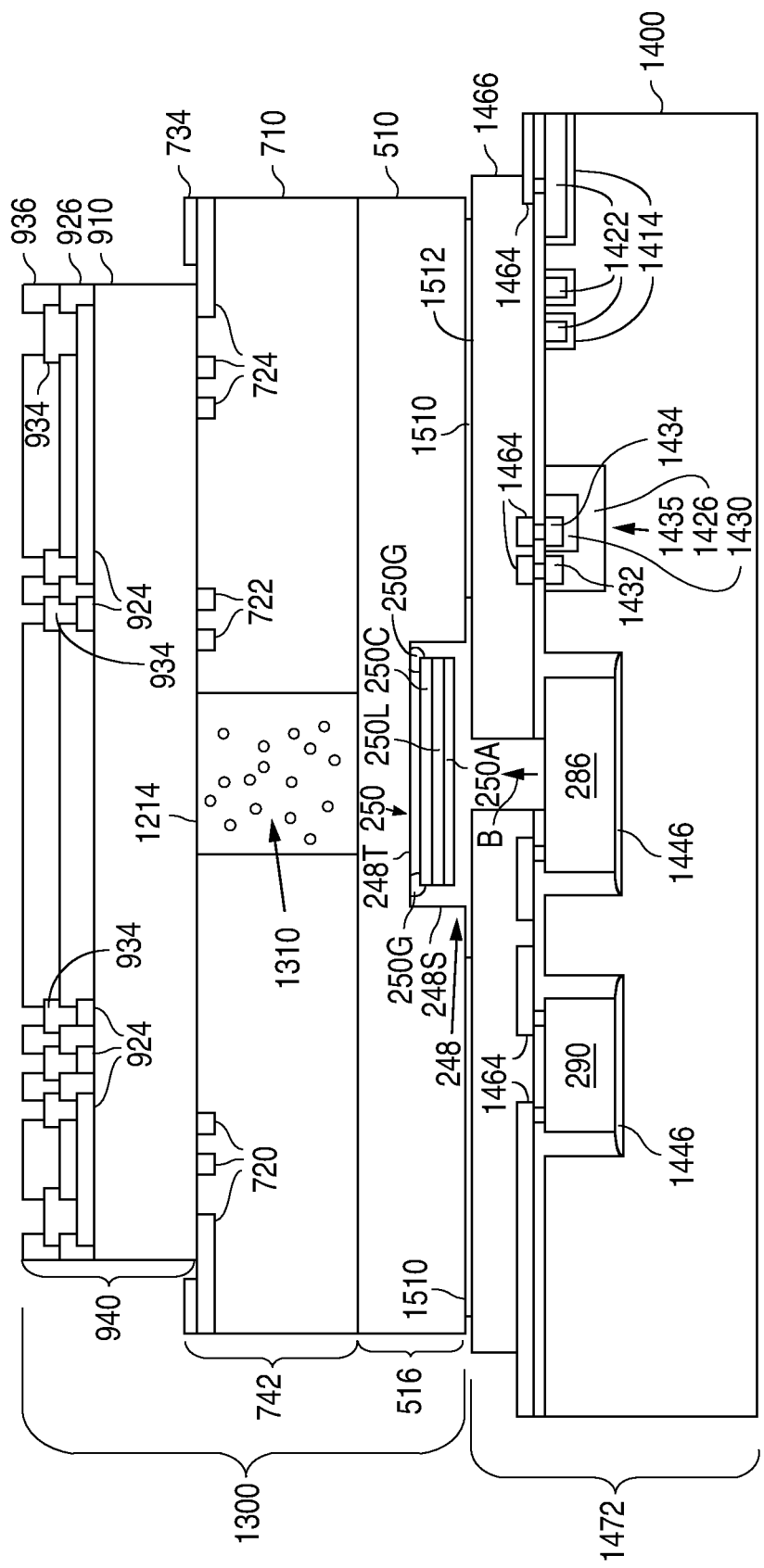
FIGS. 15A-15B are a series of cross-sectional views illustrating an example of a method of forming of a micro-fabricated atomic magnetometer in accordance with the present invention.
Figure 15B:
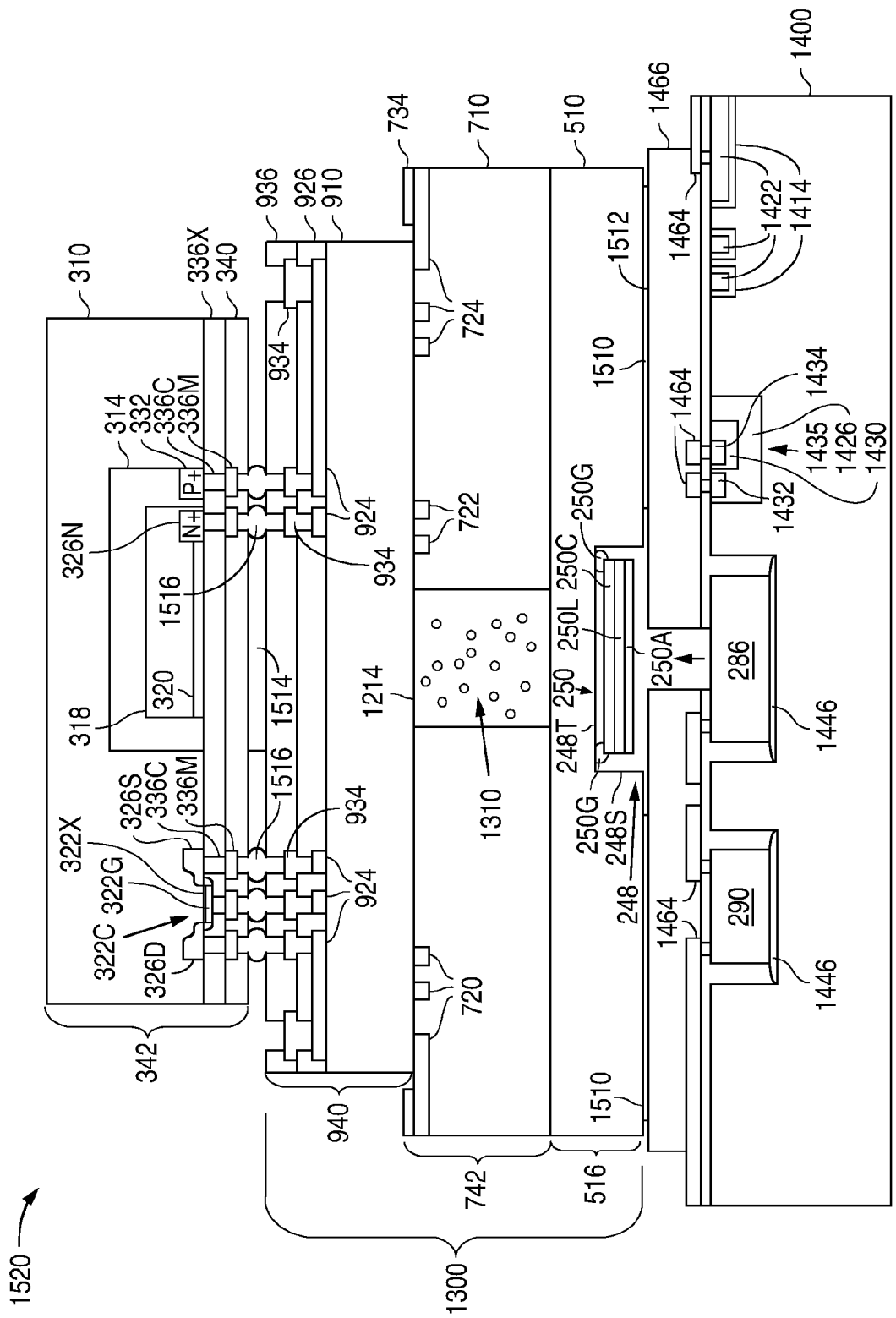

FIGS. 15A-15B show a series of cross-sectional views that illustrate an example of a method of forming of a micro-fabricated atomic magnetometer in accordance with the present invention. As shown in FIG. 15A, the method begins by placing drops of an adhesive 1510, such as a glue or die attach material, on the top surface 1512 of a base die 1472, followed by placing a vapor cell die 1300 on adhesive 1510 using a conventional pick-and-place machine. Adhesive 1510, none of which lies directly below optics package 250, attaches the vapor cell die 1300 to the base die 1472. As further shown in FIG. 15A, VCSEL 286, optics package 250, and vapor cell cavity 1214 are vertically aligned.

As shown in FIG. 15B, after the vapor cell die 1300 has been attached to the base die 1476, a transparent epoxy 1514 is placed on passivation layer 926 directly over vapor cell cavity 1214, and solder balls 1516 are placed on the exposed regions of bond pad structures 934. Transparent epoxy 1514, which has a high viscosity, is used to ensure that a transparent material touches passivation layers 340 and 936, and lies vertically between n-type region 318 and vapor cell cavity 1214. Following this, a photo detector die 342 is attached by way of solder reflow to vapor cell die 1300 as a flip chip to form a micro-fabricated atomic magnetometer 1520.

Micro-fabricated atomic magnetometer 1520 is then attached to a die attach paddle of a lead frame, and bond wires are added between the bond pad structures 294B, 734, and 936, and between atomic magnetometer 1520 and the lead frame. The lead frame is then placed in a die mold, and encapsulated with a molding compound, which also provides an under fill for the space between photo detector die 342 and vapor cell die 1300.

Figure 16:
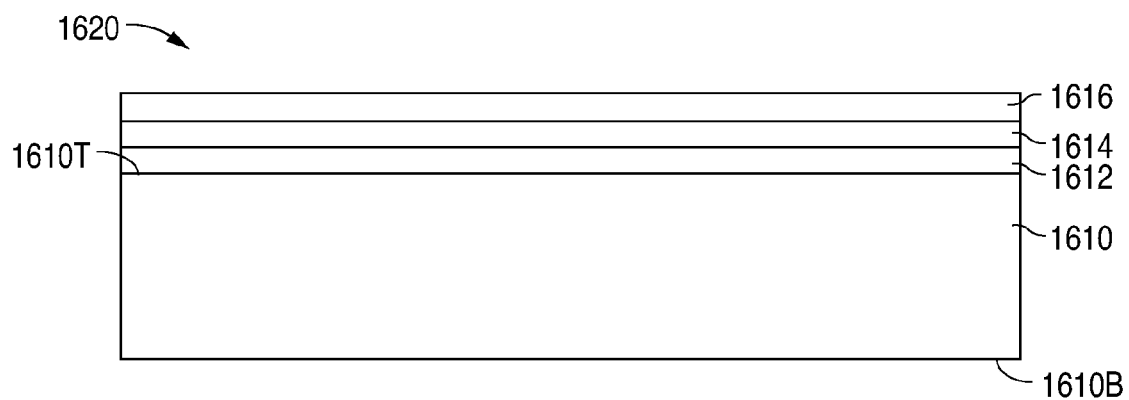
FIG. 16 is a cross-sectional view illustrating an example of an alternate method of forming a lower transparent wafer in accordance with the present invention.

FIG. 16 shows a cross-sectional view that illustrates an example of an alternate method of forming a lower transparent wafer in accordance with the present invention. The method utilizes a transparent wafer 1610 which is approximately 200-300 µm thick. Transparent wafer 1610 has a top surface 1610T and a bottom surface 1610B, and can be implemented with, for example, Eagle XG® or Pyrex® by Corning or Schott Borofloat® by Schott.

As shown in FIG. 16, the method begins by depositing a thin film of a conventional quarter wave plate material 1612, followed by the deposition of a thin film of a conventional polarizer material 1614. After this, a thin film of a conventional linear attenuator material 1616 is deposited to form a lower transparent wafer 1620.

The quarter wave plate layer 1612 has a thickness of, for example, 223.59 nm, 1117.94 nm, or 2012.29 nm (one-quarter wavelength of the light for cesium azide (894.35 nm) plus an integer number (including zero) of wavelengths of the light for cesium azide). The bottom surface 1610B is then anodically bonded to wafer 742 instead of wafer 516. One of the advantages of lower transparent wafer 1620 is that the mask and etch step required to form the optics openings and the pick-and-place steps required to attach an optics package to the lower transparent wafer can be eliminated.

Thus, a micro-fabricated atomic magnetometer and a method of forming the micro-fabricated atomic magnetometer have been described. One of the advantages of the present invention is that the present invention provides a method of forming atomic magnetometers that allows atomic magnetometers to be mass produced in conventional integrated circuit fabrication facilities.

As a result, the present invention significantly reduces the cost of atomic magnetometers. Another advantage of the present invention is the small size of the atomic magnetometers. Thus, the present invention allows atomic magnetometers to be incorporated into many more applications than were possible with conventional magnetometers.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A magnetometer comprising:
    a vapor cell die, having a top surface and a bottom surface, that is configured to receive and modulate a light, wherein the vapor cell has a vapor cavity, containing a gas that is hermetically sealed within the vapor cavity;
    a base die, having top and bottom surfaces, wherein the top surface of the base die is coupled to the bottom surface of the vapor cell die and the base die is configured to include a laser light source providing a light beam, wherein the longitudinal axis of the light beam output is vertically aligned with a photodiode and the vapor cavity;

a photo detection die, having top and bottom surfaces, the bottom of the photo detection die is coupled to the top of the vapor cell die, wherein the photo detection die has a photodiode configured to receive a modulated light and then generating a light signal that represents the magnitude of the received light;

wherein the vapor cell die further comprises:
   a lower transparent structure having a top surface and a bottom surface;
      the bottom surface of the lower transparent structure having an opening that extends from the bottom of the lower transparent structure;
   a vapor cell structure having a top surface and a bottom surface, the bottom surface of the vapor cell structure being bonded to a portion of the top surface of the lower transparent structure, the top surface of the lower transparent structure forming a bottom surface of the vapor cavity, wherein the vapor cavity extends completely through the vapor cell structure to form substantially vertical side wall surfaces of the vapor cavity;
   an upper transparent structure having top and bottom surfaces, wherein a portion of the bottom surface of the upper transparent structure is bonded to the top surface of the vapor cell structure, wherein the bottom surface of the upper transparent structure forms a top surface of the vapor cavity;
   wherein the upper transparent structure comprises:
      a plurality of metal traces that include a plurality of bond pad regions, the metal traces touching the top surface of the upper transparent structure; and
      a passivation layer that touches the top surface of the upper transparent structure and the metal traces, wherein the passivation layer is non-conductive and moisture resistant and has a plurality of openings that expose the plurality of bond pads.

2. The magnetometer of claim 1, wherein the gas in the vapor cell die is a mixture of nitrogen and alkali atoms selected from the group of Rubidium Rb or Cesium Cs.

3. The magnetometer of claim 1, wherein the vapor cell die includes a plurality of heater strips touching the vapor cell structure, the heaters strips configured to minimize the field generated by current flowing the heater strips.

4. The magnetometer of claim 1, wherein the lower transparent structure further comprises:
   an optics package attached to the upper top surface of the opening in the lower transparent structure, wherein the optics package is configured to output circularly polarized light in response to the light received from the laser light source in the base die;
   wherein the optics package includes an attenuator, a linear polarizer and a quarter wave plate circular polarizer.

5. The magnetometer of claim 1 wherein the vapor cell die has a temperature sensor that touches the vapor cell structure and lies adjacent to the vapor cavity and is configured to minimize the magnetic field that is generated by current flowing through the temperature sensor strip.

6. The magnetometer of claim 1 wherein the lower transparent structure includes:
   a glass layer;
   a layer of quarter wave plate material that touches the glass layer;
   a layer of polarizer material that touches the quarter wave plate material; and
   a layer of attenuator material that touches the layer of polarizer material.

7. The magnetometer of claim 1, wherein the base die further comprises:
   a semiconductor substrate, having a top surface and a bottom surface, the top surface having a vertical cavity surface emitting laser VCSEL opening and a die opening, each opening extending into the semiconductor substrate from the top surface of the semiconductor substrate;
   wherein, each of the VCSEL and die openings have bottom surfaces and a side wall surfaces;
   a heater that touches the top surface of the semiconductor substrate further comprising:
      an insulating layer touching the top surface of the substrate;
      an undoped polysilicon touching the top surface of the insulating layer;
      wherein the heater is configured to minimize the magnetic field that is generated by current flowing through the heater;
   a temperature sensor that touches the top surface of the semiconductor substrate, wherein the temperature sensor is implemented with a diode, wherein the diode current is configured to vary in response to the temperature of the diode;
   a VCSEL attached to the bottom surface of the VCSEL opening, wherein the VCSEL is configured to provide laser light extending vertically upward from the top surface of the semiconductor substrate;
   an integrated circuit attached to the bottom surface of the die opening, wherein the integrated circuit controls the current flow through the heater, detects the output of the temperature of the temperature sensor and controls the VCSEL;
   an interconnect structure that touches the top surface of the semiconductor substrate;
   wherein the interconnect structure further comprises:
      a non-conductive structure that touches the top surface of the semiconductor substrate;
      a plurality of contacts that extend through the non-conductive structure to make electrical contact with the heater, the temperature sensor, the VCSEL and the integrated circuit;
      wherein the non-conductive structure has an opening located over the VCSEL that exposes the laser light output of the VCSEL;
      metal structures that lie on the non-conductive structure and touch the plurality of contacts, wherein the metal structure interconnects the heater, the temperature sensor, the VCSEL and the integrated circuit and also includes a plurality of pads; and
      a passivation layer that covers the non-conductive structure, the metal structures and includes a plurality of openings that expose the plurality of pads for electrical connections, the passivation also includes an opening to expose the laser output of the VCSEL.

8. The magnetometer of claim 1, wherein the photo detection die further comprises:
   a p-type single crystal semiconductor substrate, having top and bottom surfaces;
   a photodiode that touches the top surface of the semiconductor substrate;
   wherein the photodiode further comprises:
      a p− well that touches the semiconductor substrate;

an n− region that touches the p− well;
a p+ contact region that touches the p− well;
an n+ contact region that touches the n− region;
wherein the p− well has a dopant concentration greater than the dopant concentration of the p− semiconductor substrate;
a plurality of circuit elements that a are formed in and on the top surface of the semiconductor substrate, wherein the circuit elements include transistors, resistors, capacitors and diodes, wherein the circuit elements are configured to form electronic circuits to control the photodiode and amplify signals for the photodiode to generate a light signal;
an interconnect structure that touches the top surface of the semiconductor substrate and the plurality of circuit elements;
wherein the interconnect structure further includes:
a non-conductive structure that touches the top surface of the semiconductor substrate and includes a plurality of contact openings that extend through the non-conductive structure;
a plurality of contacts extending through the plurality of contact openings in the non-conductive structure to make electrical connections with the p+ and n+ regions of the photodiode and conductive regions of the circuit elements;
a plurality of metal structures and lying on the non-conductive structure and touching the plurality of contacts, wherein the plurality of metal structures include a plurality of pads;
a passivation layer that covers the non-conductive structure and the plurality of metal structures, wherein the passivation layer is non-conductive, moisture resistant and has a plurality of openings to expose the plurality of pads included on the plurality of metal structures.

9. The magnetometer of claim 1, wherein the vapor cell die transparent structures are implemented in a glass containing a sodium ionic impurity, wherein the sodium ionic impurity is included to make the glass suitable for anodic bonding to single-crystal silicon.

10. The magnetometer of claim 1, wherein the vapor cell die is attached to the photo detection die with a transparent epoxy that touches a passivation layer on the top surface of the vapor cell die and a passivation layer on the top surface of the photo detection die, wherein a plurality of solder balls are configured to electrically couple metal structures of the photodiode die to bond pad structures of the vapor cell die.

11. The magnetometer of claim 1, wherein the vapor cell die is attached to the base die with a conventional glue or die attach adhesive that touches a passivation layer on the top surface of the base die and a portion of the bottom surface of the vapor cell die surrounding an opening.

12. The magnetometer of claim 1, wherein the vapor cell structure is comprised of p-type single crystal silicon between 0.715 and 1.00 mm thick.

13. The magnetometer of claim 12, wherein portions of the top of the vapor cell structure are implanted with an n+ dopant to form a resistive heater strip and a resistive temperature sensor strip.

14. The magnetometer of claim 13, wherein bond pad structures are formed to touch and lie over the ends of each of the heater and temperature sensor strips.

15. The magnetometer of claim 1, wherein the vapor cavity has a width of approximately 1 mm.

* * * * *